United States Patent
Kayaba et al.

(10) Patent No.: US 10,759,964 B2
(45) Date of Patent: Sep. 1, 2020

(54) SEMICONDUCTOR FILM COMPOSITION, METHOD OF MANUFACTURING SEMICONDUCTOR FILM COMPOSITION, METHOD OF MANUFACTURING SEMICONDUCTOR MEMBER, METHOD OF MANUFACTURING SEMICONDUCTOR PROCESSING MATERIAL, AND SEMICONDUCTOR DEVICE

(71) Applicant: MITSUI CHEMICALS, INC., Minato-ku, Tokyo (JP)

(72) Inventors: Yasuhisa Kayaba, Urayasu (JP); Hirofumi Tanaka, Tsukuba (JP); Hiroko Wachi, Chiba (JP); Shoko Ono, Kawasaki (JP)

(73) Assignee: MITSUI CHEMICALS, INC., Minato-Ku, Tokyo (JP)

(*) Notice: Subject to any disclaimer, the term of this patent is extended or adjusted under 35 U.S.C. 154(b) by 117 days.

(21) Appl. No.: 15/776,013

(22) PCT Filed: Nov. 16, 2016

(86) PCT No.: PCT/JP2016/084008
§ 371 (c)(1),
(2) Date: May 14, 2018

(87) PCT Pub. No.: WO2017/086360
PCT Pub. Date: May 26, 2017

(65) Prior Publication Data
US 2018/0327547 A1    Nov. 15, 2018

(30) Foreign Application Priority Data

Nov. 16, 2015  (JP) ................. 2015-224196

(51) Int. Cl.
| | | |
|---|---|---|
| C09D 177/06 | (2006.01) |
| C08G 73/02 | (2006.01) |
| C08G 73/10 | (2006.01) |
| H01L 21/02 | (2006.01) |
| H01L 21/3105 | (2006.01) |
| C08G 69/42 | (2006.01) |
| H01L 23/29 | (2006.01) |
| C08K 5/092 | (2006.01) |
| C08K 3/28 | (2006.01) |
| C08K 5/09 | (2006.01) |

(52) U.S. Cl.
CPC .......... *C09D 177/06* (2013.01); *C08G 69/42* (2013.01); *C08G 73/0293* (2013.01); *C08G 73/1003* (2013.01); *H01L 21/02118* (2013.01); *H01L 21/02142* (2013.01); *H01L 21/02203* (2013.01); *H01L 21/02282* (2013.01); *H01L 21/02318* (2013.01); *H01L 21/02343* (2013.01); *H01L 21/3105* (2013.01); *H01L 23/296* (2013.01); *C08K 3/28* (2013.01); *C08K 5/09* (2013.01); *C08K 5/092* (2013.01)

(58) Field of Classification Search
None
See application file for complete search history.

(56) References Cited

U.S. PATENT DOCUMENTS

| | | |
|---|---|---|
| 2011/0241210 A1 | 10/2011 | Ono et al. |
| 2013/0171826 A1 | 7/2013 | Ono et al. |
| 2015/0179357 A1* | 6/2015 | Ichinomiya ............ H01G 11/30 429/217 |
| 2015/0187670 A1 | 7/2015 | Ono et al. |
| 2016/0049343 A1 | 2/2016 | Kayaba et al. |
| 2016/0122605 A1 | 5/2016 | Hayashi |

FOREIGN PATENT DOCUMENTS

| | | |
|---|---|---|
| EP | 1618238 B1 | 9/2010 |
| EP | 2876675 A1 | 5/2015 |
| EP | 2889335 A1 | 7/2015 |
| JP | 2003-171486 A | 6/2003 |
| JP | 2008-056897 A | 3/2008 |
| KR | 2011-0086573 A | 7/2011 |
| WO | WO 2010/137711 A1 | 12/2010 |
| WO | WO 2012/033172 A1 | 3/2012 |
| WO | WO 2014/013956 A1 | 1/2014 |
| WO | WO 2014/156616 A1 | 10/2014 |
| WO | WO 2014/196636 A1 | 12/2014 |

OTHER PUBLICATIONS

Extended Search Report issued by the European Patent Office in corresponding European Patent Application No. 16866361.5-1102 dated Jul. 2, 2019 (13 pages).
Notice of Submission of Opinion issued by the Korean Patent Office in corresponding Korean Patent Application No. 2018-7013722 dated Jul. 1, 2019 (9 pages).
International Search Report (PCT/ISA/210) dated Feb. 21, 2017, by the Japanese Patent Office as the International Searching Authority for International Application No. PCT/JP2016/084008.
Written Opinion (PCT/ISA/237) dated Feb. 21, 2017, by the Japanese Patent Office as the International Searching Authority for International Application No. PCT/JP2016/084008.

* cited by examiner

*Primary Examiner* — Ana L. Woodward
(74) *Attorney, Agent, or Firm* — Buchanan Ingersoll & Rooney PC

(57) ABSTRACT

A composition for forming a film for semiconductor devices including: a compound (A) including a cationic functional group containing at least one of a primary nitrogen atom or a secondary nitrogen atom and having a weight average molecular weight of from 10,000 to 400,000; a crosslinking agent (B) which includes the three or more —C(=O)OX groups (X is a hydrogen atom or an alkyl group having from 1 to 6 carbon atoms) in the molecule, in which from one to six of three or more —C(=O)OX groups are —C(=O)OH groups, and which has a weight average molecular weight of from 200 to 600; and water (D), in which the compound (A) is an aliphatic amine.

14 Claims, No Drawings

SEMICONDUCTOR FILM COMPOSITION, METHOD OF MANUFACTURING SEMICONDUCTOR FILM COMPOSITION, METHOD OF MANUFACTURING SEMICONDUCTOR MEMBER, METHOD OF MANUFACTURING SEMICONDUCTOR PROCESSING MATERIAL, AND SEMICONDUCTOR DEVICE

TECHNICAL FIELD

The present invention relates to a semiconductor film composition, a method of manufacturing a semiconductor film composition, a method of manufacturing a semiconductor member, a method of manufacturing a semiconductor processing material, and a semiconductor device.

BACKGROUND ART

Conventionally, in various technical fields such as the field of electronic devices, application of compositions containing polymers to members has been conducted.

For example, a method of producing a composite in which a composition containing a polymer such as polyethyleneimine or a polyethyleneimine derivative having cationic functional groups and having a weight average molecular weight of from 2,000 to 1,000,000 and having a pH of from 2.0 to 11.0 is applied to the surfaces of members A and B having predetermined conditions is known (see, for example, Patent Document 1). Patent Document 1 describes that a composite member to which a composition is applied is washed with a rinsing liquid containing a polyvalent carboxylic acid.
Patent Document 1 WO 2014/156616

SUMMARY OF INVENTION

Problems to be Solved by the Invention

In Patent Document 1, a polymer such as polyethyleneimine is applied to a member, a rinse liquid containing a polyvalent carboxylic acid is coated on the member, and then crosslinked by a heating reaction, and the number of steps is large. However, when a polymer such as a polyethyleneimine and a polyvalent carboxylic acid are mixed to prepare a composition to be applied to a member, the polymer and polyvalent carboxylic acid aggregate and the composition becomes cloudy, and when the composition is applied to a member, formation of agglomerates, pits and the like causes large unevenness, resulting in a film with insufficient smoothness, which is a problematic.

An embodiment of the invention has been made in view of the above problem, and an object of the embodiment is to provide a semiconductor film composition from which a film having few aggregates and pits, and having high smoothness can be obtained, a method of manufacturing the same, and a method of manufacturing a semiconductor member using the semiconductor film composition, and a method of manufacturing a semiconductor processing material using the semiconductor film composition, and a semiconductor device provided with a reaction product having high smoothness.

Means for Solving the Problems

Specific means for solving the above described problems are as follows.

<1> A semiconductor film composition comprising:
a compound (A) including a cationic functional group containing at least one of a primary nitrogen atom or a secondary nitrogen atom and having a weight average molecular weight of from 10,000 to 400,000;
a crosslinking agent (B) which includes three or more —C(=O)OX groups (X is a hydrogen atom or an alkyl group having from 1 to 6 carbon atoms) in a molecule, wherein from one to six of the three or more —C(=O)OX groups are —C(=O)OH groups, and which has a weight average molecular weight of from 200 to 600; and
water (D),
wherein the compound (A) is an aliphatic amine.
<2> The semiconductor film composition according to <1>, wherein the crosslinking agent (B) has a ring structure in the molecule.
<3> The semiconductor film composition according to <2>, wherein the ring structure is at least one of a benzene ring or a naphthalene ring.
<4> The semiconductor film composition according to any one of <1> to <3>, wherein the crosslinking agent (B) is a compound in which at least one X in the three or more —C(=O)OX groups is an alkyl group having from 1 to 6 carbon atoms.
<5> The semiconductor film composition according to any one of <1> to <4>, further comprising at least one additive (C) selected from the group consisting of an acid (C-1) having a carboxy group and having a weight average molecular weight of from 46 to 195 and a base (C-2) having a nitrogen atom and having a weight average molecular weight of from 17 to 120.
<6> The semiconductor film composition according to any one of <1> to <5>, wherein the weight average molecular weight of the compound (A) is from 10,000 to 200,000.
<7> The semiconductor film composition according to any one of <1> to <6>, wherein a pH of the semiconductor film composition at 25° C. is 7.0 or less.
<8> The semiconductor film composition according to any one of <1> to <7>, which is used for an adhesion layer between a metal and an insulating film.
<9> The semiconductor film composition according to any one of <1> to <8>, which is used for a pore seal material of a low dielectric constant material.
<10> The semiconductor film composition according to any one of <1> to <9>, which is used for a filling material for a recess formed in a substrate.
<11> A method of manufacturing the semiconductor film composition according to any one of <1> to <10>,
the method comprising:
a mixing step of mixing the compound (A) and the crosslinking agent (B).
<12> The method according to <11>, wherein the mixing step comprises mixing a mixture of an acid (C-1) having a carboxy group and having a weight average molecular weight of from 46 to 195 and the compound (A), and the crosslinking agent (B).
<13> The method according to <11>, wherein the mixing step comprises mixing a mixture of a base (C-2) having a nitrogen atom and having a weight average molecular weight of from 17 to 120 and the crosslinking agent (B), and the compound (A).
<14> A method of manufacturing a semiconductor member using the semiconductor film composition according to any one of <1> to <10>, the method comprising:
an application step of applying the semiconductor film composition to a substrate; and a heating step of heating the substrate to which the semiconductor film composition has been applied, at a temperature of from 250° C. to 425° C.

<15> A method of manufacturing a semiconductor processing material using the semiconductor film composition according to any one of <1> to <7>, the method comprising:

an application of applying the semiconductor film composition to a substrate; and a heating step of heating the substrate to which the semiconductor film composition has been applied, at a temperature of from 250° C. to 425° C.

<16> A semiconductor device comprising:

a substrate; and a reaction product of a compound (A) including a cationic functional group containing at least one of a primary nitrogen atom or a secondary nitrogen atom and having a weight average molecular weight of from 10,000 to 400,000, and a crosslinking agent (B) which includes three or more —C(=O)OX groups (X is a hydrogen atom or an alkyl group having from 1 to 6 carbon atoms) in a molecule, wherein from one to six of the three or more —C(=O)OX groups are —C(=O)OH groups, and which has a weight average molecular weight of from 200 to 600.

<17> The semiconductor device according to <16>, wherein the reaction product includes at least one of an amide bond or an imide bond.

Effects of the Invention

According to an embodiment of the invention, a semiconductor film composition from which a film having few aggregates and pits, and having high smoothness can be obtained, a method of manufacturing the same, and a method of manufacturing a semiconductor member using the semiconductor film composition, and a method of manufacturing a semiconductor processing material using the semiconductor film composition, and a semiconductor device provided with a reaction product having high smoothness can be provided.

DESCRIPTION OF EMBODIMENT

In the present specification, a numeral value range represented by "(a value) to (a value)" means a range including the numeral values represented before and after "(a value) to (a value)" as a lower limit value and an upper limit value, respectively.

[Semiconductor Film Composition]

Hereinafter, an embodiment of a semiconductor film composition according to the invention will be described. The semiconductor film composition according to the embodiment includes a compound (A) including a cationic functional group containing at least one of a primary nitrogen atom or a secondary nitrogen atom and having a weight average molecular weight of from 10,000 to 400,000, a crosslinking agent (B) which includes three or more —C(=O)OX groups (X is a hydrogen atom or an alkyl group having from 1 to 6 carbon atoms) in a molecule, in which from one to six of the three or more —C(=O)OX groups are —C(=O)OH groups, and which has a weight average molecular weight of from 200 to 600, and water (D). The compound (A) is an aliphatic amine.

A semiconductor film composition according to the embodiment is used. Specifically, by coating the semiconductor film composition on a member to form a film, a film having few aggregates and pits and high smoothness can be obtained. By using the semiconductor film composition according to the embodiment, a film having high smoothness as compared with the technique of Patent Document 1 (WO 2014/156616) can be easily obtained.

By using the semiconductor film composition according to the embodiment, a film having small unevenness and favorable smoothness can be formed. For example, when a film is formed using the semiconductor film composition according to the embodiment on a smooth substrate such as a silicon substrate, a film in which the difference between the maximum value and the minimum value of the film thickness is 25% or less of the average film thickness with a field of view of 500 nm width at 200,000 magnification of a scanning electron microscope (SEM) can be formed.

In addition, in the technique of Patent Document 1 described above, since a polymer such as polyethyleneimine is applied to a member, a rinse liquid containing a polyvalent carboxylic acid is applied on the member, and then the polymer is crosslinked by heating reaction, the applied polymer may dissolve in a rinsing liquid containing a polyvalent carboxylic acid. Therefore, with respect to a film formed on a member, the thickness of a film on the surface of a large-diameter wafer is unlikely to be uniform, and it is not easy to control the film thickness.

In the technique of Patent Document 1 described above, when a thick film of several tens of nanometers or more is formed, since a polyvalent carboxylic acid hardly permeates to the interface between a member and a polymer, the composition the film in the thickness direction is unlikely to be uniform.

On the other hand, in the embodiment, by applying a semiconductor film composition containing a compound (A) and a crosslinking agent (B) to a member to form a film, smoothness can be enhanced and composition uniformity in the film thickness direction can be enhanced.

By using the semiconductor film composition according to the embodiment, a film having excellent smoothness and composition uniformity in the film thickness direction, and having, for example, a thickness of from 0.5 nm to 5 μm can be formed. A film having excellent smoothness can be formed on the surface of a large diameter silicon substrate. For example, when the film thickness is set to from 5 nm to 150 nm, the film thickness variation between the center and an edge portion of a 300 mmφ silicon substrate can be ±5% or less.

The semiconductor film composition according to the embodiment is a composition for forming a film for semiconductor devices. Such a composition is used for forming: a gap fill material (buried planarization film) filled in a recess formed in a substrate; an insulating material (buried insulating film) filled in a recess formed in a substrate; a pore seal material (pore seal film) provided between a low dielectric constant material such as a porous material and a metal and having insulating properties, adhesiveness, pore sealing property, and the like; an insulating material (through-silicon via insulating film) which is provided between a metal and a silicon substrate or between a metal and an insulating film on a via sidewall of a through-silicon via substrate and has adhesiveness and insulating properties; a pore filling material (pore filling film) for protecting a porous material from an etch damage and the like by penetrating into pores of the porous material; or the like. In particular, such a composition is suitably used for a pore seal material of a low dielectric constant material, an adhesion layer between a metal and an insulating film, and a filling material (buried planarization film) for a recess formed in a substrate.

(Compound (A))

The composition according to the embodiment includes a compound (A) including a cationic functional group containing at least one of a primary nitrogen atom or a secondary nitrogen atom and having a weight average molecular weight of from 10,000 to 400,000, and the compound (A) is an aliphatic amine. The compound (A) preferably has no siloxane bonds (Si—O bond).

The compound (A) is a compound including a cationic functional group containing at least one of a primary nitrogen atom or a secondary nitrogen atom. The cationic functional group is not particularly limited as long as the group is a functional group which can be positively charged and contains at least one of a primary nitrogen atom or a secondary nitrogen atom.

In addition to the primary nitrogen atom and the secondary nitrogen atom, the compound (A) may contain a tertiary nitrogen atom.

Herein, a "primary nitrogen atom" refers to a nitrogen atom (for example, a nitrogen atom contained in a primary amino group (—NH$_2$ group)) bonded only to two hydrogen atoms and one atom other than a hydrogen atom, or a nitrogen atom (cation) bonded to only three hydrogen atoms and one atom other than a hydrogen atom.

A "secondary nitrogen atom" refers to a nitrogen atom (in other words, a nitrogen atom contained in a functional group represented by the following Formula (a)) bonded only to one hydrogen atom and two atoms other than a hydrogen atom, or a nitrogen atom (cation) bonded only to two hydrogen atoms and two atoms other than a hydrogen atom.

A "tertiary nitrogen atom" refers to a nitrogen atom bonded only to three atoms other than a hydrogen atom (in other words, a nitrogen atom which is a functional group represented by the following Formula (b)) or a nitrogen atom (cation) bonded only to one hydrogen atom and three atoms other than a hydrogen atom.

In Formulae (a) and (b), * represents a bonding position with an atom other than a hydrogen atom.

Here, the functional group represented by Formula (a) may be a functional group constituting a part of a secondary amino group (—NHR$^a$ group; wherein R$^a$ represents an alkyl group), or may be a divalent linking group contained in the skeleton of the polymer.

The functional group represented by Formula (b) (in other words, a tertiary nitrogen atom) may be a functional group constituting a part of a tertiary amino group (—NR$^b$R$^c$ group; wherein R$^b$ and R$^c$ each independently represent an alkyl group) or may be a trivalent linking group contained in the skeleton of the polymer.

The weight average molecular weight of the compound (A) is from 10,000 to 400,000, and is preferably from 10,000 to 200,000. When the weight average molecular weight is 10,000 or more, a smooth film with favorable yield tends to be formed.

Herein, a weight average molecular weight refers to a weight average molecular weight in terms of polyethylene glycol measured by a gel permeation chromatography (GPC) method.

Specifically, the weight average molecular weight is calculated by an analysis software (48011 data station manufactured by SYSTEM INSTRUMENTS Co., Ltd.) using an aqueous solution having a sodium nitrate concentration of 0.1 mol/L as a developing solvent, using an analyzer Shodex GPC-101 and two analytical columns (TSKgel G6000PWXL-CP and TSKgel G3000PWXL-CP manufactured by Tosoh Corporation) and a reference column (TSKgel SCX manufactured by Tosoh Corporation) at a flow rate of 1.0 mL/min, and using polyethylene glycol as a standard product.

The compound (A) may further contain an anionic functional group, a nonionic functional group, or the like, if necessary.

The nonionic functional group may be a hydrogen bond receptor or a hydrogen bond doner. Examples of the nonionic functional group include a hydroxy group, a carbonyl group, and an ether group (—O—).

The anionic functional group is not particularly limited as long as the group is a functional group capable of being negatively charged. Examples of the anionic functional group include a carboxylic acid group, a sulfonic acid group, and a sulfuric acid group.

More specific examples of the compound (A) which is an aliphatic amine include polyalkyleneimine which is a polymer of an alkyleneimine such as ethylene imine, propylene imine, butylene imine, pentylene imine, hexylene imine, heptylene imine, octylene imine, trimethylene imine, tetramethylene imine, pentamethylene imine, hexamethylene imine, or octamethylene imine; polyallylamine; and polyacrylamide.

Polyethyleneimine (PEI) can be prepared by a known method described in Japanese Patent Publication (JP-B) No. S43-8828, JP-B No. S49-33120, Japanese Patent Application Laid-Open (JP-A) No. 2001-2123958, WO 2010/137711, or the like. Polyalkyleneimines other than polyethyleneimine can also be prepared by a similar method to that of polyethyleneimine.

It is also preferable that the compound (A) is a derivative of the above-described polyalkyleneimine (polyalkyleneimine derivative; particularly preferably polyethyleneimine derivative). The derivative of polyalkyleneimine is not particularly limited as long as the derivative is a compound which can be produced using the polyalkyleneimine described above. Specific examples thereof include a derivative of polyalkyleneimine in which an alkyl group (preferably an alkyl group having from 1 to 10 carbon atoms), an aryl group, or the like is introduced into a polyalkyleneimine, and a derivative of polyalkyleneimine obtained by introducing a cross-linkable group such as a hydroxyl group into a polyalkyleneimine.

These derivatives of polyalkyleneimine can be produced by a method performed commonly using the polyalkyleneimine described above. Specifically, these derivatives of polyalkyleneimine can be produced based on the method described in, for example, JP-A No. H06-016809, or the like.

As a derivative of polyalkyleneimine, a highly branched type polyalkyleneimine obtained by increasing the branching degree of a polyalkyleneimine by reacting the polyalkyleneimine with a cationic functional group-containing monomer is also preferable.

Examples of the method of obtaining a highly branched type polyalkyleneimine include a method in which a polyalkyleneimine containing plural secondary nitrogen atoms in the backbone is reacted with a cationic functional group-containing monomer and thus at least a part of the plural secondary nitrogen atoms are substituted with the cationic functional group-containing monomer, and a method in which a polyalkyleneimine containing plural primary nitrogen atoms at terminals is reacted with a cationic functional group-containing monomer and thus at least a part of the plural primary nitrogen atoms are substituted with the cationic functional group-containing monomer.

Examples of the cationic functional group introduced in order to increase the branching degree include an aminoethyl group, an aminopropyl group, a diaminopropyl group, an aminobutyl group, a diaminobutyl group, and a triaminobutyl group, and an aminoethyl group is preferable from the viewpoint of decreasing the cationic functional group equivalent weight and increasing the cationic functional group density.

The polyethyleneimine and a derivative thereof may be a commercially available product. For example, the polyethyleneimine and a derivative thereof may be selected from those commercially available from NIPPON SHOKUBAI CO., LTD., BASF SE, MP Biomedicals, LLC., or the like if appropriate and used.

As described above, the compound (A) has a cationic functional group containing at least one of a primary nitrogen atom or a secondary nitrogen atom. Here, in a case in which the compound (A) contains a primary nitrogen atom, the proportion of the primary nitrogen atoms in all the nitrogen atoms in the compound (A) is preferably 20% by mole or more, more preferably 25% by mole or more, and still more preferably 30% by mole or more. The compound (A) may have a cationic functional group containing a primary nitrogen atom and containing no nitrogen atoms (for example, a secondary nitrogen atom or a tertiary nitrogen atom) other than the primary nitrogen atom.

In a case in which the compound (A) contains a secondary nitrogen atom, the proportion of the secondary nitrogen atoms in all the nitrogen atoms in the compound (A) is preferably from 5% by mole to 50% by mole, and more preferably from 10% by mole to 45% by mole.

In addition to the primary nitrogen atom and the secondary nitrogen atom, the compound (A) may contain a tertiary nitrogen atom. In a case in which the compound (A) contains a tertiary nitrogen atom, the proportion of the tertiary nitrogen atom in all the nitrogen atoms in the compound (A) is preferably from 20% by mole to 50% by mole, and more preferably from 25% by mole to 45% by mole.

In the present embodiment, the content of the compound (A) in the composition is not particularly limited, and for example, may be from 0.001% by mass to 20% by mass with respect to the total composition. The content is preferably from 0.01% by mass to 10% by mass, and more preferably from 0.04% by mass to 5% by mass.

(Crosslinking Agent (B))

The composition according to the embodiment includes a crosslinking agent (B) which includes three or more —C(=O)OX groups (X is a hydrogen atom or an alkyl group having from 1 to 6 carbon atoms) in the molecule, in which from one to six of three or more —C(=O)OX groups (hereinafter also referred to as "COOX") are —C(=O)OH groups (hereinafter also referred to as "COOH"), and which has a weight average molecular weight of from 200 to 600.

The crosslinking agent (B) is a compound having three or more —C(=O)OX groups in the molecule (X is a hydrogen atom or an alkyl group having from 1 to 6 carbon atoms), and preferably is a compound having from three to six —C(=O)OX groups in the molecule, and more preferably, is a compound having from three or four —C(=O)OX groups in the molecule.

In the crosslinking agent (B), examples of X in the —C(=O)OX group include a hydrogen atom or an alkyl group having from 1 to 6 carbon atoms, and among them, a hydrogen atom, a methyl group, an ethyl group, and a propyl group are preferable. Xs in the —C(=O)OX groups may be the same or different from each other.

The crosslinking agent (B) is a compound having from 1 to 6 —C(=O)OH groups in the molecule wherein X is a hydrogen atom, and is preferably a compound having from 1 to 4 —C(=O)OH groups in the molecule, is more preferably a compound having from 2 to 4 —C(=O)OH groups in the molecule, and is still more preferably a compound having from two or three —C(=O)OH groups in the molecule.

The crosslinking agent (B) is a compound having a weight average molecular weight of from 200 to 600. Preferably, the crosslinking agent is a compound having from 200 to 400.

The crosslinking agent (B) preferably has a ring structure in the molecule. Examples of the ring structure include an alicyclic structure and an aromatic ring structure. The crosslinking agent (B) may have a plurality of ring structures in the molecule, and the plurality of ring structures may be the same or different from each other.

Examples of the alicyclic structure include an alicyclic structure having from 3 to 8 carbon atoms, and preferably an alicyclic structure having from 4 to 6 carbon atoms, and the inside of the ring structure may be saturated or unsaturated. More specific examples of the alicyclic structure include a saturated alicyclic structure such as a cyclopropane ring, a cyclobutane ring, a cyclopentane ring, a cyclohexane ring, a cycloheptane ring, or a cyclooctane ring; and an unsaturated alicyclic structure such as a cyclopropene ring, a cyclobutene ring, a cyclopentene ring, a cyclohexene ring, a cycloheptene ring, or a cyclooctene ring.

The aromatic ring structure is not particularly limited as long as the structure is a ring structure exhibiting aromaticity, and examples thereof include: a benzene aromatic ring such as a benzene ring, a naphthalene ring, an anthracene ring, or a perylene ring; an aromatic heterocyclic ring such as a pyridine ring or a thiophene ring; and a nonbenzene aromatic ring such as an indene ring or an azulene ring.

The cyclic structure of the crosslinking agent (B) in the molecule is preferably, for example, at least one selected from the group consisting of a cyclobutane ring, a cyclopentane ring, a cyclohexane ring, a benzene ring and a naphthalene ring, and from the viewpoint of further improving the heat resistance of a film obtained from a composition, at least one of a benzene ring or a naphthalene ring is more preferable.

As described above, the crosslinking agent (B) may have a plurality of ring structures in the molecule, and may have a biphenyl structure, a benzophenone structure, a diphenyl ether structure, or the like when the ring structure is benzene.

The crosslinking agent (B) preferably has a fluorine atom in the molecule, more preferably has from 1 to 6 fluorine atoms in the molecule, and still more preferable has from 3 to 6 fluorine atoms in the molecule. For example, the crosslinking agent (B) may have a fluoroalkyl group in the molecule, and specifically may have a trifluoroalkyl group or a hexafluoroisopropyl group.

Further examples of the crosslinking agent (B) include a carboxylic acid compound such as an alicyclic carboxylic acid, a benzene carboxylic acid, a naphthalene carboxylic acid, a diphthalic acid, or a fluorinated aromatic ring carboxylic acid; and a carboxylic acid ester compound such as an alicyclic carboxylic acid ester, a benzene carboxylic acid ester, a naphthalene carboxylic acid ester, a diphthalic acid ester, or a fluorinated aromatic ring carboxylic acid ester. The carboxylic acid ester compound is a compound which includes carboxy groups (—C(=O)OH group) in the molecule and in which, in each of three or more —C(=O)OX groups, at least one X is an alkyl group having from 1 to 6 carbon atoms (in other words, an ester bond is contained). In the composition according to the embodiment, since the crosslinking agent (B) is a carboxylic acid ester compound, aggregation due to association of the compound (A) and the crosslinking agent (B) in the composition is suppressed, agglomerates and pits are reduced, and a film having a higher smoothness or a film having a large film thickness can be obtained, and the film thickness can be easily adjusted.

The carboxylic acid compound is preferably a tetravalent or less carboxylic acid compound containing four or less —C(=O)OH groups, and more preferably a trivalent or tetravalent carboxylic acid compound containing three or four —C(=O)OH groups.

The carboxylic acid ester compound is preferably a compound containing three or less carboxy groups (—C(=O)OH groups) in the molecule and three or less ester bonds, and more preferably a compound containing two or less carboxy groups in the molecule and two or less ester bonds.

In the carboxylic acid ester compound, when, in each of three or more —C(=O)OX groups, X is an alkyl group having from 1 to 6 carbon atoms, X is preferably a methyl group, an ethyl group, a propyl group, a butyl group or the like, and from the viewpoint of further suppressing aggregation by association between the compound (A) and the crosslinking agent (B) in the composition, X is preferably an ethyl group or a propyl group.

Specific examples of the carboxylic acid compound include, but are not limited to, an alicyclic carboxylic acid such as 1,2,3,4-cyclobutane tetracarboxylic acid, 1,2,3,4-cyclopentane tetracarboxylic acid, 1,3,5-cyclohexane tricarboxylic acid, 1,2,4-cyclohexane tricarboxylic acid, 1,2,4,5-cyclohexanetetracarboxylic acid, or 1,2,3,4,5,6-cyclohexanehexacarboxylic acid; a benzene carboxylic acid such as 1,2,4-benzene tricarboxylic acid, 1,3,5-benzene tricarboxylic acid, pyromellitic acid, benzene pentacarboxylic acid, or mellitic acid; a naphthalene carboxylic acid such as 1,4,5,8-naphthalenetetracarboxylic acid or 2,3,6,7-naphthalenetetracarboxylic acid; a diphthalic acid such as 3,3',5,5'-tetracarboxydiphenylmethane, biphenyl-3,3',5,5'-tetracarboxylic acid, biphenyl-3,4',5-tricarboxylic acid, biphenyl-3,3',4,4'-tetracarboxylic acid, benzophenone-3,3',4,4'-tetracarboxylic acid, 4,4'-oxydiphthalic acid, 3,4'-oxydiphthalic acid, 1,3-bis(phthalic acid) tetramethyldisiloxane, 4,4'-(ethyne-1,2-diyl)diphthalic acid, 4,4'-(1,4-phenylenebis(oxy)) diphthalic acid, 4,4'-([1,1'-biphenyl]-4,4'-diylbis(oxy))diphthalic acid, or 4,4'-((oxybis(4,1-phenylene))bis(oxy))diphthalic acid; a perylene carboxylic acid such as perylene-3,4,9,10-tetracarboxylic acid; an anthracene carboxylic acid such as anthracene-2,3,6,7-tetracarboxylic acid; and a fluorinated aromatic carboxylic acid such as 4,4'-(hexafluoroisopropylidene)diphthalic acid, 9,9-bis(trifluoromethyl)-9H-xanthene-2,3,6,7-tetracarboxylic acid, or 1,4-ditrifluoromethyl pyromellitic acid.

Specific examples of the carboxylic acid ester compound include a compound in which at least one carboxy group in a specific example of the carboxylic acid compound is substituted with an ester group. Examples of the carboxylic acid ester compound include half esterified compounds represented by the following Formulae (B-1) to (B-6).

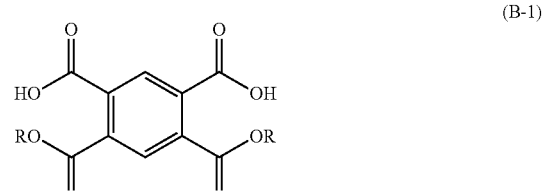

(B-1)

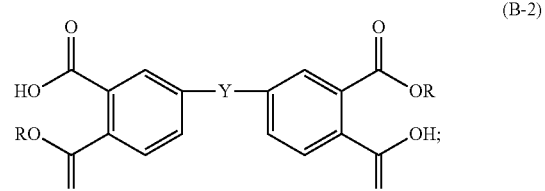

(B-2)

Y = O, C = O, C(CF$_3$)$_2$

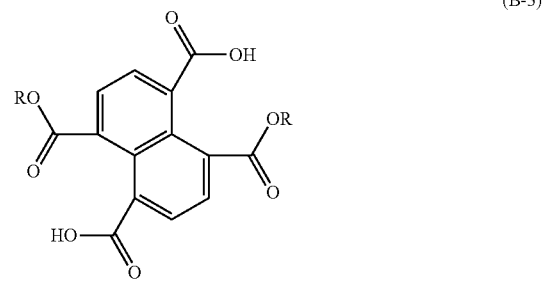

(B-3)

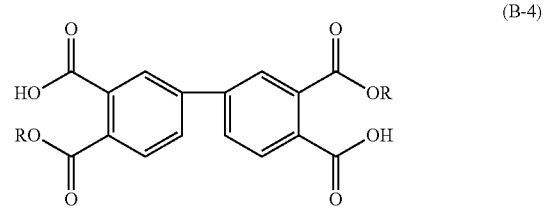

(B-4)

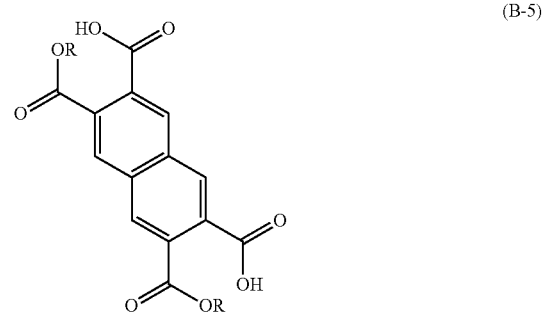

(B-5)

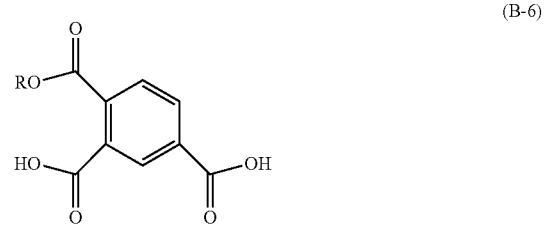

(B-6)

R in Formulae (B-1) to (B-6) is an alkyl group having from 1 to 6 carbon atoms, and among these, a methyl group, an ethyl group, a propyl group, or a butyl group is preferable, and an ethyl group or a propyl group is more preferable.

The half esterified compound can be produced, for example, by mixing a carboxylic anhydride which is an anhydride of the aforementioned carboxylic acid compound in an alcohol solvent, and opening a carboxylic acid anhydride.

In the present embodiment, the content of the crosslinking agent (B) in the composition is not particularly limited, and for example, the ratio (COOH/N) of the number of carboxy groups in the crosslinking agent (B) to the total number of nitrogen atoms in the compound (A) is preferably from 0.1 to 3.0, more preferably from 0.3 to 2.5, and still more preferably from 0.4 to 2.2. When COOH/N is from 0.1 to 3.0, a film having a crosslinked structure such as amide or imide between a compound (A) and a crosslinking agent (B) after the heat treatment, and having excellent heat resistance and insulating properties can be produced by using a composition.

(Water (D))

The composition according to the embodiment includes water (D) (preferably ultrapure water). The water (D) may be heavy water or may contain heavy water.

The content of water (D) in the composition is not particularly limited, and is, for example, with respect to the total composition, from 1.0% by mass to 99.9985% by mass, and preferably from 40% by mass to 99.9985% by mass.

(Additive (C))

The composition according to the embodiment may contain an additive (C) in addition to the compound (A), the crosslinking agent (B), and the water (D) described above. Examples of the additive (C) include an acid (C-1) having a carboxy group and having a weight average molecular weight of from 46 to 195, and a base (C-2) having a nitrogen atom and having a weight average molecular weight of from 17 to 120.

The acid (C-1) is an acid having a carboxy group and having a weight average molecular weight of from 46 to 195. It is presumed that, since the composition according to the embodiment contains the acid (C-1) as the additive (C), aggregation due to association of the compound (A) and the crosslinking agent (B) is inhibited by ionic bonding of an amino group in the compound (A) and a carboxyl group in the acid (C-1). More specifically, since the interaction (for example, electrostatic interaction) between an ammonium ion derived from an amino group in the compound (A) and a carboxylate ion derived from a carboxy group in the acid (C-1) is stronger than the interaction between an ammonium ion derived from an amino group in the compound (A) and a carboxylate ion derived from a carboxy group in the crosslinking agent (B), aggregation is assumed to be suppressed. It should be noted that the invention is not limited at all by the above assumption.

The acid (C-1) is not particularly limited as long as the acid has a carboxy group and has a weight average molecular weight of from 46 to 195, and examples thereof include a monocarboxylic acid compound, a dicarboxylic acid compound, and an oxydicarboxylic acid compound. More specific examples of the acid (C-1) include a formic acid, an acetic acid, a malonic acid, an oxalic acid, a citric acid, a benzoic acid, a lactic acid, a glycolic acid, a glyceric acid, a butyric acid, a methoxyacetic acid, an ethoxyacetic acid, a phthalic acid, a terephthalic acid, a picolinic acid, a salicylic acid, and a 3,4,5-trihydroxybenzoic acid.

In the embodiment, the content of the acid (C-1) in the composition is not particularly limited, and, for example, the ratio (COOH/N) of the number of carboxy groups in the acid (C-1) to the total number of nitrogen atoms in the compound (A) is preferably from 0.01 to 10, more preferably from 0.02 to 6, still more preferably from 0.02 to 1.5, and particularly preferably from 0.02 to 1.2.

The base (C-2) is a base having a nitrogen atom and having a weight average molecular weight of from 17 to 120. It is presumed that, since the composition according to the embodiment contains the base (C-2) as the additive (C), aggregation due to association of the compound (A) and the crosslinking agent (B) is inhibited by ionic bonding of a carboxy group in the crosslinking agent (B) and an amino group in the base (C-2). More specifically, since the interaction between a carboxylate ion derived from a carboxy group in the crosslinking agent (B) and an ammonium ion derived from an amino group in the base (C-2) is stronger than the interaction between an ammonium ion derived from an amino group in the compound (A) and a carboxylate ion derived from a carboxy group in the crosslinking agent (B), aggregation is assumed to be suppressed. It should be noted that the invention is not limited at all by the above assumption.

The base (C-2) is not particularly limited as long as the base has a nitrogen atom and has a weight average molecular weight of from 17 to 120, and examples thereof include a monoamine compound and a diamine compound. More specific examples of the base (C-2) include ammonia, ethylamine, ethanolamine, diethylamine, triethylamine, ethylenediamine, N-acetylethylenediamine, N-(2-aminoethyl) ethanolamine, and N-(2-aminoethyl) glycine.

In the embodiment, the content of the base (C-2) in the composition is not particularly limited, and for example, the ratio (N/COOH) of the number of nitrogen atoms in the base (C-2) to the number of carboxy groups in the crosslinking agent (B) is preferably from 0.5 to 5, and more preferably from 0.9 to 3.

(Other Components)

The content of sodium and potassium in the composition according to the embodiment is preferably 10 mass ppb or less on an element basis. When the content of sodium or potassium is 10 mass ppb or less on an element basis, occurrence of inconvenience in the electrical characteristics of a semiconductor device such as malfunction of a transistor can be suppressed.

The composition according to the embodiment may further contain an amine compound having a ring structure in the molecule and having a weight average molecular weight of from 90 to 600. Examples of the amine compound having a ring structure in the molecule having a weight average molecular weight of from 90 to 600 include an alicyclic amine, an aromatic ring amine, and a heterocyclic (aminocyclic)amine. The ring structure may have a plurality of ring structures in the molecule, and the plurality of ring structures may be the same or different. As the amine compound having a ring structure, an amine compound having an aromatic ring is more preferable since a thermally more stable compound is easily obtained.

An amine compound having a ring structure in the molecule and having a weight average molecular weight of from 90 to 600 is preferably a compound having a primary amine from the viewpoint of easily forming a crosslinked structure such as imide, imide amide, or amide with the crosslinking agent (B) and enhancing the heat resistance. From the viewpoint of easily increasing the number of crosslinked structures such as imide, imide amide, or amide with the crosslinking agent (B) and further enhancing the heat resistance, the amine compound is more preferably a diamine compound having two primary amines, a triamine compound having three primary amines or the like.

Examples of the alicyclic amine include cyclohexylamine and dimethylaminocyclohexane.

Examples of the aromatic ring amine include diaminodiphenyl ether, xylenediamine, diaminobenzene, diaminotoluene, methylenedianiline, dimethyldiaminobiphenyl, bis (trifluoromethyl) diaminobiphenyl, diaminobenzophenone, diaminobenzanilide, bis(aminophenyl)fluorene, bis(aminophenoxy)benzene, bis(aminophenoxy)biphenyl, dicarboxydiaminodiphenylmethane, diaminoresorcin, dihydroxybenzidine, diaminobenzidine, 1,3,5-triaminophenoxybenzene, 2,2'-dimethylbenzidine, and tris (4-aminophenyl) amine.

Examples of the heterocyclic ring of a heterocyclic amine include a heterocyclic ring containing a sulfur atom as a heteroatom (for example, a thiophene ring), or a heterocyclic ring containing a nitrogen atom as a heteroatom (for example, a 5-membered ring such as a pyrrole ring, a pyrrolidine ring, a pyrazole ring, an imidazole ring, or a triazole ring; a 6-membered ring such as an isocyanuryl ring, a pyridine ring, a pyridazine ring, a pyrimidine ring, a pyrazine ring, a piperidine ring, a piperazine ring, or a triazine ring; or a condensed ring such as an indole ring, an indoline ring, a quinoline ring, an acridine ring, a naphthyridine ring, a quinazoline ring, a purine ring, or a quinoxaline ring).

Examples of heterocyclic amines having a nitrogen-containing heterocyclic ring include melamine, ammeline, melam, melem, and tris(4-aminophenyl) amine.

Examples of amine compounds having both a heterocyclic ring and an aromatic ring include N2,N4,N6-tris(4-aminophenyl)-1,3,5-triazine-2,4,6-triamine.

The composition according to the embodiment may contain a solvent (water-soluble solvent) other than water (D). Examples of solvents other than water (D) include a polar solvent such as a protic inorganic compound; an alcohol such as methanol, ethanol, 1-propanol, 2-propanol, 1-butanol, 2-butanol, isobutyl alcohol, isopentyl alcohol, cyclohexanol, ethylene glycol, propylene glycol, 2-methoxyethanol, 2-ethoxyethanol, benzyl alcohol, diethylene glycol, triethylene glycol, or glycerin; an ether such as tetrahydrofuran or dimethoxyethane; an aldehyde or ketone such as furfural, acetone, ethyl methyl ketone, or cyclohexanone; an acid derivative such as acetic anhydride, ethyl acetate, butyl acetate, ethylene carbonate, propylene carbonate, formaldehyde, N-methylformamide, N,N-dimethylformamide, N-methylacetamide, N,N-dimethylacetamide, N-methyl-2-pyrrolidone, or hexamethylphosphoramide; a nitrile such as acetonitrile or propionitrile; a nitro compound such as nitromethane or nitrobenzene; or a sulfur compound such as dimethylsulfoxide.

The composition according to the embodiment may contain a phthalic acid, a benzoic acid, or the like, or a derivative thereof, for example, for improving electric characteristics.

The composition according to the embodiment may contain benzotriazole or a derivative thereof, for example, for suppressing corrosion of copper.

The pH of the composition according to the embodiment is not particularly limited, and is preferably from 2.0 to 12.0, and more preferably 7.0 or less. In a case in which the pH is 7.0 or less, when used as a pore seal material of a low dielectric constant material, a film is formed on the surface of the low dielectric constant material, and a film is less likely to be formed on the surface of a conductive portion such as a metal, whereby selectivity can be provided depending on the material of the surface on which a film is formed.

[Method of Manufacturing Composition]

Hereinafter, a method of manufacturing a composition according to an embodiment of the invention will be described. The method of producing a composition according to the embodiment includes a mixing step of mixing a compound (A) and a crosslinking agent (B). As described above, the composition contains water (D), and water (D) may be added to the compound (A), the crosslinking agent (B), and a mixture of the compound (A) and the crosslinking agent (B) at an arbitrary timing for manufacturing the composition. The timing of adding the other components is also not particularly limited.

In the method of manufacturing a composition according to the embodiment, at least one additive (C) selected from the group consisting of an acid (C-1) having a carboxy group and having a weight average molecular weight of from 46 to 195 and the base (C-2) having a nitrogen atom and having a weight average molecular weight of from 17 to 120 may be added to the compound (A) or the crosslinking agent (B) in a mixing step. The timing of adding the additive (C) is not particularly limited.

When an acid (C-1) is added as an additive (C), the mixing step is preferably a step of mixing a mixture of the acid (C-1) and the compound (A) and the crosslinking agent (B). In other words, the compound (A) and the acid (C-1) are preferably mixed in advance before mixing the compound (A) and the crosslinking agent (B). By this, when the compound (A) and the crosslinking agent (B) are mixed, whitening and gelation (gelation is not preferable because it may take time to make the composition transparent) of a composition can be suitably suppressed.

When the base (C-2) is added as the additive (C), the mixing step is preferably a step of mixing the mixture of the base (C-2) and the crosslinking agent (B) with the compound (A). In other words, it is preferable to previously mix the crosslinking agent (B) and the base (C-2) before mixing the compound (A) and the crosslinking agent (B). By this, when the compound (A) and the crosslinking agent (B) are mixed, whitening and gelation (gelation is not preferable because it may take time to make the composition transparent) of a composition can be suitably suppressed.

[Method of Manufacturing Semiconductor Member]

Hereinafter, a method of manufacturing the semiconductor member according to the embodiment will be described. A method of manufacturing a semiconductor member according to the embodiment includes an application step of applying a composition to a substrate and a heating step of heating a substrate to which a composition is applied at a temperature of from 250° C. to 425° C.

<Applying Step>

The applying step in the embodiment is a step of applying a composition to a substrate.

Examples of the substrate include a semiconductor substrate such as a silicon substrate, a glass substrate, a quartz substrate, a stainless substrate, and a plastic substrate. The shape of the substrate is also not particularly limited, and may be any of a plate shape or a dish shape. For example, the silicon substrate may be a silicon substrate on which an interlayer insulating layer (low-k film) is formed, and in the silicon substrate, fine grooves (recesses), fine through holes, or the like may be formed.

In the applying step in the embodiment, the method of applying a composition is not particularly limited, and a commonly used method can be used.

Examples of commonly used methods include a dipping method, a spraying method, a spin coating method, and a bar coating method. For example, when forming a film having a thickness of microns, it is preferable to use a bar coating method, and in a case in which a film having a film thickness of nano size (several nm to several hundred nm) is formed, it is preferable to use a spin coating method.

For example, the method of applying a composition by a spin coating method is not particularly limited, and for example, a method of dropping a composition onto the surface of a substrate while rotating the substrate with a spin coater, then increasing the number of revolutions of the substrate and drying can be used.

In a method of applying a composition by a spin coating method, a condition such as the number of revolutions of a substrate, the dropping amount and dropping time of a composition, or the number of revolutions of a substrate at the time of drying is not particularly limited, and can be adjusted if appropriate in consideration of the thickness of a film to be formed and the like.

<Drying Step>

The manufacturing method according to the embodiment may include a drying step of drying a substrate to which a composition is applied at a temperature of from 80° C. to 250° C., before a heating step described below. The temperature refers to the temperature of the surface of a substrate to which a composition is applied.

The above temperature is more preferably from 90° C. to 200° C., and more preferably from 100° C. to 150° C.

Drying in this step can be carried out by a usual method, for example, drying can be carried out using a hot plate.

There are no particular restrictions on the atmosphere to be dried in this step, and for example, drying may be performed in an air atmosphere or in an atmosphere of an inert gas (nitrogen gas, argon gas, helium gas, or the like).

The drying time is not particularly limited, and is preferably 300 seconds or less, more preferably 200 seconds or less, still more preferably 120 seconds or less, and particularly preferably 80 seconds or less.

The lower limit of the drying time is not particularly limited, and the lower limit may be, for example, 10 seconds (preferably 20 seconds, and more preferably 30 seconds).

<Washing Step>

The manufacturing method according to the embodiment may include a washing step of washing a substrate to which a composition is applied with water or the like in order to remove excessive composition applied to a substrate before a heating step described below. In a case in which the manufacturing method according to the embodiment has the above-described drying step, a washing step is preferably performed after the drying step.

<Heating Step>

The manufacturing method according to the embodiment further includes a heating step of heating a substrate to which a composition is applied under a condition of a temperature of from 200° C. to 425° C.

The temperature refers to a temperature of the surface of a substrate to which a composition is applied.

By including such a heating step, the compound (A) and the crosslinking agent (B) react by heating to obtain a reaction product, and a film containing the reaction product is formed.

The temperature is preferably from 250° C. to 400° C., and more preferably from 300° C. to 400° C.

There is no particular limitation on the pressure at which heating is performed in the heating step, and heating is preferably performed at an absolute pressure of higher than 17 Pa and equal to or lower than the atmospheric pressure.

The absolute pressure is more preferably from 1,000 Pa to atmospheric pressure, still more preferably from 5,000 Pa to atmospheric pressure, and particularly preferably from 10,000 Pa to atmospheric pressure.

Heating in the heating step can be carried out by a usual method using a furnace or a hot plate. As the furnace, for example, SPX-1120 manufactured by Apex Corporation, VF-1000LP manufactured by Koyo Thermo Systems Co., Ltd., or the like can be used.

Heating in this step may be carried out under an air atmosphere or under an atmosphere of an inert gas (nitrogen gas, argon gas, helium gas, or the like).

The heating time in the heating step is not particularly limited, and the heating time is, for example, 1 hour or less, preferably 30 minutes or less, more preferably 10 minutes or less, and particularly preferably 5 minutes or less. The lower limit of the heating time is not particularly limited, and may be, for example, 0.1 minutes.

For the purpose of shortening the heating process time, ultraviolet irradiation may be performed on the surface of a substrate to which a composition is applied.

As ultraviolet rays, an ultraviolet light having a wavelength of from 170 nm to 230 nm, an excimer light having a wavelength of 222 nm, an excimer light having a wavelength of 172 nm, or the like is preferable. Ultraviolet irradiation is preferably performed in an inert gas atmosphere.

<Example of Semiconductor Member>

Examples of the semiconductor member include a semiconductor member in which a gap fill material (buried planarization film) is filled in a recess formed in a substrate, a semiconductor member in which an insulating material (buried insulating film) is filled in a recess formed in a substrate, a semiconductor member provided with a pore seal material (pore seal film) having insulating properties, adhesiveness, pore sealing property, or the like between a substrate containing a low dielectric constant material such as a porous material and a metal, a semiconductor member provided with an insulating film (through-silicon via insulating film) having adhesiveness and insulating properties provided between a metal and a silicon substrate or between a metal and an insulating film on a via sidewall of a through-silicon via substrate, and a semiconductor member having a pore filling material (pore filling film) for protecting a porous material from etch damage or the like by penetrating into pores of a substrate containing a porous material.

In a semiconductor member in which a recess fixated in a substrate is filled with a buried planarization film, the thickness of the buried planarizing film is, for example, from 30 nm to 200 nm, and preferably from 50 nm to 150 nm.

Such a semiconductor member can be used as a member in which a buried planarization film is provided in a via, for example, in a via first process when a copper multilayer wiring is formed by a dual damascene process.

In a case in which a buried planarization film is formed in a groove having a narrow width and a large aspect ratio (depth/width), from the viewpoint of enhancing the filling property to the groove, it is preferable to form a buried planarization film by applying a composition according to the embodiment to a recess (preferably, applying by a spin coating method).

In a semiconductor member in which a recess formed in a substrate is filled with a buried insulating film, the thickness of the buried insulating film is, for example, from 30 nm to 200 nm, and preferably from 50 nm to 150 nm.

Examples of the semiconductor member include a member using a technique (STI: shallow trench isolation) of forming an element isolation region by providing a buried insulating film having insulation in a groove of a silicon substrate, a member provided between switching elements such as a metal-oxide-semiconductor field-effect transistor (MOSFET) formed in advance with a buried insulating film having insulation, a member provided with a buried insulating film having insulation as a pre-metal insulating film (PMD) on a MOSFET, a member provided between the lowermost wirings (W, Ti/TiN/AlCu/TiN or the like) formed in advance with a buried insulating film having insulation, a member provided with an insulating film having insulation as an intermetal insulating film (IMD) on the lowermost layer wiring, and a member provided with a buried insulating film having insulation as an inter-wiring layer insulating film (ILD) in a groove between copper wirings formed in advance.

In a case in which a buried insulating film is formed in a groove having a narrow width and a large aspect ratio (depth/width), from the viewpoint of enhancing the filling property to the groove, it is preferable to form a buried insulating film by applying a composition according to the embodiment to a recess (preferably by a spin coating method).

In a semiconductor member in which a pore seal film having insulation, adhesiveness, pore sealing property, and the like is provided between a substrate containing a low dielectric constant material such as a porous material and a metal, the thickness of the pore seal film is, for example, from 0.5 nm to 15 nm, and preferably from 1.5 nm to 12 nm. The semiconductor member may be, for example, a member in which a pore seal film serving as an adhesion layer is provided between a wall surface of a through hole formed in a substrate and a metal disposed in the through hole.

In a semiconductor member in which a through-silicon via insulating film is provided between a metal and a silicon substrate at the via sidewall of a through-silicon via substrate, the thickness of the through-silicon via insulating film is, for example, from 100 nm to 5 µm, and preferably from 500 nm to 2 µm.

In a semiconductor member in which a through-silicon via insulating film is provided between a metal and an insulating film at the via sidewall of a through-silicon via substrate, the thickness of the through-silicon via insulating film is, for example, from 0.5 nm to 100 nm, and preferably from 1 nm to 30 nm.

In a semiconductor member having a pore filling film penetrating into pores of a substrate containing a porous material, the thickness of the pore filling film is, for example, from 30 nm to 200 nm, and preferably from 50 nm to 150 nm.

[Method of Manufacturing Semiconductor Processing Material]

Hereinafter, a method of manufacturing a semiconductor processing material according to the embodiment will be described. A method of manufacturing a semiconductor processing material according to the embodiment includes an application step of applying a composition to a substrate and a heating step of heating a substrate to which a composition is applied under a condition of a temperature of from 250° C. to 425° C.

Since each step of the method of manufacturing a semiconductor processing material is similar to each step of the above-described method of manufacturing a semiconductor member, the description thereof will be omitted.

Examples of the semiconductor processing material include a sacrificial film temporarily formed in a manufacturing process of a semiconductor device and removed in a later step.

[Semiconductor Device]

Hereinafter, a semiconductor device according to the embodiment will be described.

The semiconductor device according to the embodiment includes a substrate; and a reaction product of a compound (A) including a cationic functional group containing at least one of a primary nitrogen atom or a secondary nitrogen atom and having a weight average molecular weight of from 10,000 to 400,000, and a crosslinking agent (B) which includes three or more —C(=O)OX groups (X is a hydrogen atom or an alkyl group having from 1 to 6 carbon atoms) in a molecule, in which from one to six of the three or more —C(=O)OX groups are —C(=O)OH groups, and which has a weight average molecular weight of from 200 to 600. The reaction product of the compound (A) and the crosslinking agent (B) has high smoothness and is excellent in composition uniformity in the film thickness direction.

The reaction product of the compound (A) and the crosslinking agent (B) preferably has at least one of an amide bond or an imide bond.

EXAMPLES

Hereinafter, the invention will be specifically described with reference to Examples, but the invention is not limited to these Examples.

In the following, ultrapure water (Milli-Q water manufactured by Millipore Corporation, resistance of 18 MΩ·cm (25° C.) or less) was used as "water".

<Preparation of Branched Polyethyleneimines 1 to 3>

Branched polyethyleneimines 1 to 3 (branched polyethyleneimine) used in the following Examples and Comparative Examples were prepared. Commercially available branched polyethyleneimines 1 and 2 were used, and branched polyethyleneimine 3 was synthesized by a procedure described below.

<Branched Polyethyleneimines 1 and 2>

As the branched polyethyleneimine 1, polyethyleneimine (Mw=from 16,000 to 145,000, primary nitrogen atom/secondary nitrogen atom/tertiary nitrogen atom=32/38/30) manufactured by MP Biomedicals, LLC was used.

As the branched polyethyleneimine 2, polyethyleneimine (Mw=70,000, primary nitrogen atom/secondary nitrogen atom/tertiary nitrogen atom=31/40/29) manufactured by BASF SE <Synthesis of Branched Polyethyleneimine 3>

(Synthesis of Modified Polyethyleneimine 3)

In accordance with the following Reaction Scheme 1, modified polyethyleneimine 3 was synthesized using polyethyleneimine as a starting material. The polymer structures in the following Reaction Scheme 1 and Reaction Scheme 2 are schematically illustrated structures, and the arrangement of a tertiary nitrogen atom and a secondary nitrogen atom, the proportion of secondary nitrogen atoms substituted by Boc-aminoethyl groups, which will be described below, or the like, varies depending on the synthesis conditions.

- Reaction Scheme 1 -

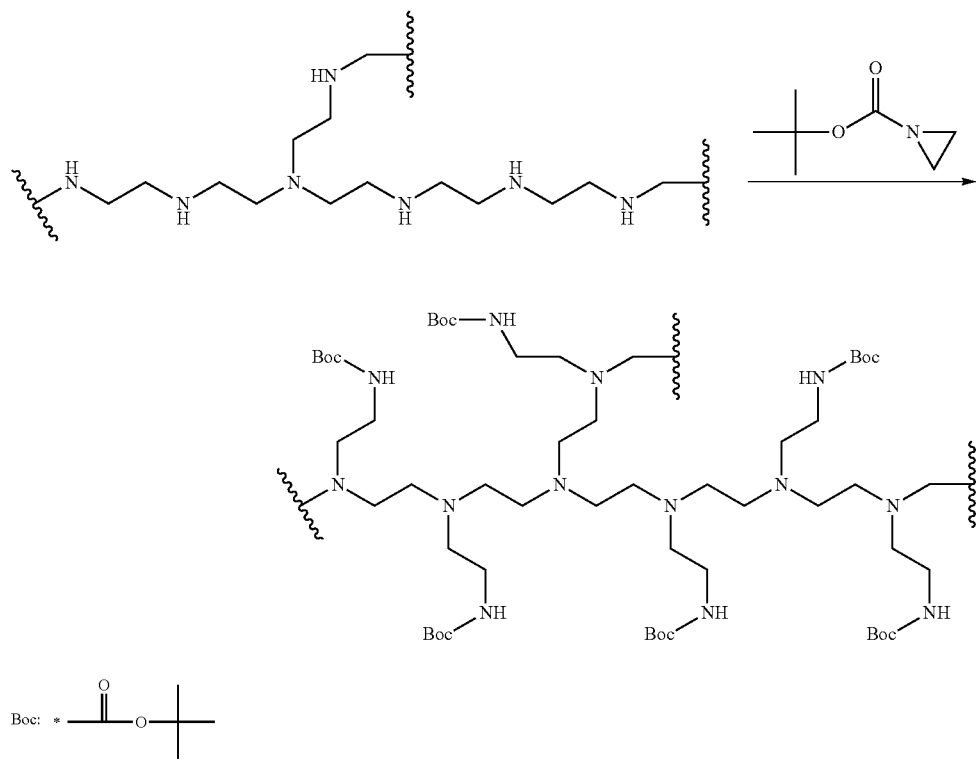

The detailed operation of the above Reaction Scheme 1 is as follows.

61.06 g of polyethyleneimine (50% aqueous solution) manufactured by MP Biomedicals, LLC was dissolved in 319 mL of isopropanol, 102 g (710 mmol) of N-t-butoxycarbonyl (t-butoxycarbonyl group is also referred to as "Boc" in this Example) aziridine was added, and heated under reflux for 3 hours to obtain modified polyethyleneimine 3 having a structure in which a Boc-aminoethyl group was introduced to polyethyleneimine After confirming that the raw material N-Boc aziridine disappeared by thin layer chromatography (TLC), a small amount was sampled and the structure was confirmed by $^1$H-NMR. From $^1$H-NMR, the introduction rate of Boc-aminoethyl group to polyethyleneimine was calculated to be 95%.

—NMR Measurement Result of Modified Polyethyleneimine 3—

$^1$H-NMR(CD$_3$OD); δ3.3-3.0 (br.s, 2), 2.8-2.5 (Br.s, 6.2), 1.45 (s, 9)

(Synthesis of Branched Polyethyleneimine 3)

Using the modified polyethyleneimine 3 as a starting material, branched polyethyleneimine 3 was synthesized according to the following Reaction Scheme 2. Branched polyethyleneimine 3 is a hyper branched polyethyleneimine in which the proportion of tertiary nitrogen atoms is larger than that of branched polyethyleneimines 1 and 2.

- Reaction Scheme 2 -

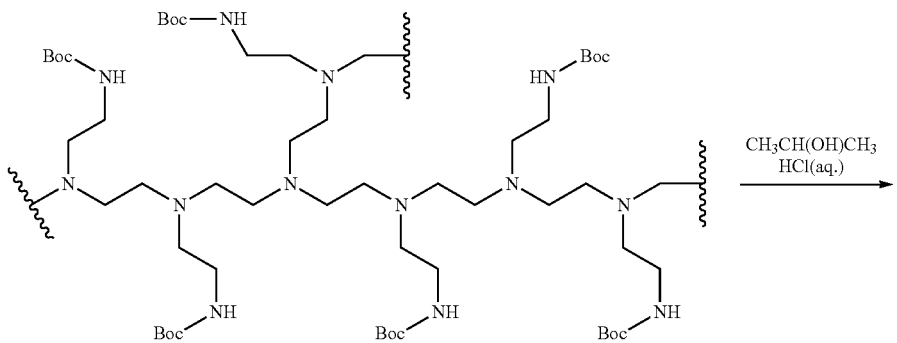

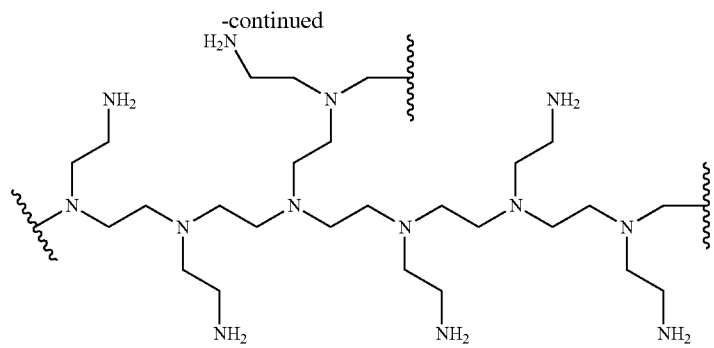

The detailed operation of the above Reaction Scheme 2 is as follows.

To an isopropanol solution of the modified polyethyleneimine 3, 124 mL of 12 N hydrochloric acid was slowly added. The resultant solution was heated and stirred at 50° C. for 4 hours while paying attention to generation of gas. A gum-like reaction product was formed in the reaction system as gas was generated. After the generation of gas was completed, the reaction product was cooled, after cooling, a solvent separated from the gum-like reaction product was removed and washed three times with 184 mL of methanol. After washing, the reaction product was dissolved in water, chlorine ion was removed with an anion exchange polymer, and an aqueous solution containing 58 g of branched polyethyleneimine 3 was obtained.

—NMR Measurement Result of Branched Polyethyleneimine 3—

$^1$H-NMR (D$_2$O); δ2.8-2.4 (br.m)

$^{13}$C-NMR (D$_2$O); δ(integration ratio) 57.2 (1.0), 54.1 (0.38), 52.2 (2.26), 51.6 (0.27), 48.5 (0.07), 46.7 (0.37), 40.8 (0.19), 38.8 (1.06).

For the branched polyethyleneimine 3, the weight average molecular weight, the amount (mol %) of the primary nitrogen atom, the amount (mol %) of the secondary nitrogen atom, and the amount (mol %) of the tertiary nitrogen atom were measured, respectively.

As a result, the weight average molecular weight was 75,000, the amount of the primary nitrogen atom was 45 mol %, the amount of the secondary nitrogen atom was 11 mol %, and the amount of the tertiary nitrogen atom was 44 mol %.

For the solution obtained by dissolving polymer sample (branched polyethyleneimine 3) in heavy water, from the result of measuring $^{13}$C-NMR at 80° C. by a decoupling method with single pulse inverse gate method in an AVANCE 500 type nuclear magnetic resonance apparatus, manufactured by Bruker Corporation, to which amine (nitrogen atom) each carbon atom was bonded was analyzed, and the amount of primary nitrogen atom (mol %), the amount of secondary nitrogen atom (mol %) and the amount of tertiary nitrogen atom (mol %) were calculated based on the integrated value of the result. Attributions are described in European Polymer Journal, 1973, Vol. 9, pp. 559 and the like.

The weight-average molecular weight was measured using an analyzer Shodex GPC-101 and using a column Asahipak GF-7M HQ, and was calculated using polyethylene glycol as the reference standard. An aqueous solution having an acetic acid concentration of 0.5 mol/L and a sodium nitrate concentration of 0.1 mol/L was used as a developing solvent.

Here, the amount (mol %) of the primary nitrogen atom, the amount (mol %) of the secondary nitrogen atom, and the amount (mol %) of the tertiary nitrogen atom are respectively expressed by the following Formulae A to C.

Amount of primary nitrogen atom(mol %)=(mol number of primary nitrogen atom/(mol number of primary nitrogen atom+mol number of secondary nitrogen atom+mol number of tertiary nitrogen atom))×100   Formula A Amount of secondary nitrogen atom(mol %)=(mol number of secondary nitrogen atom/(mol number of primary nitrogen atom+mol number of secondary nitrogen atom+mol number of tertiary nitrogen atom))×100   Formula B Amount of tertiary nitrogen atom(mol %)=(mol number of tertiary nitrogen atom/(mol number of primary nitrogen atom+mol number of secondary nitrogen atom+mol number of tertiary nitrogen atom))×100   Formula C Using the branched polyethyleneimines 1 to 3 prepared as described above, the compositions of Examples A1 to C11 were prepared. Details are as follows.

Mixing of each of a solution of the compound (A), a solution of the crosslinking agent (B), a solution obtained by adding the acid (C-1) to the compound (A), and a solution obtained by adding the base (C-2) to the crosslinking agent (B) was carried out after confirming that there was no precipitate in each solution to be mixed.

Example A1

An aqueous solution (concentration: 2% by mass) of branched polyethyleneimine 1 (BPEI_1; branched polyethyleneimine, corresponding to the compound (A)) obtained as described above and 1,3,5-benzenetricarboxylic acid (135BTC, corresponding to the crosslinking agent (B)) ethanol solution (concentration of 2% by mass) having three carboxy groups were prepared. 135BTC ethanol solution was then added dropwise little by little to the BPEI_1 aqueous solution. At this time, a 135BTC ethanol solution was added dropwise to the BPEI_1 aqueous solution until the ratio (COOH/N) of the number of carboxy groups in the crosslinking agent (B) (135BTC in the Example) to the total number of nitrogen atoms in the compound (A) (BPEI_1 in the Example) reached 0.7 to prepare a composition. The above-described COOH/N was 0 before starting dropwise addition of 135BTC ethanol solution, the numerical value rises as the 135BTC ethanol solution was added dropwise, and reached 0.7 after completion of the dropwise addition of the 135BTC ethanol solution.

Example A2

Acetic acid (AA) was added to a branched polyethyleneimine 1 (BPEI_1) aqueous solution (concentration after addition of acetic acid: 2% by mass). At this time, an acetic acid was added to the BPEI_1 solution until the ratio (COOH/N) of the number of carboxy groups in acid (C-1) (acetic acid in the Example) to the total number of nitrogen atoms in the compound (A) (BPEI_1 in the Example) was 0.5. Thereafter, a 135BTC ethanol solution (concentration: 2% by mass) was added dropwise to the BPEI_1 solution. Next, similarly to Example A1, a 135BTC ethanol solution was added dropwise to the BPEI_1 aqueous solution until the ratio (COOH/N) of the number of carboxy groups in the crosslinking agent (B) to the total number of nitrogen atoms in the compound (A) reached 0.7 to prepare a composition.

The dropping amount of 135BTC at a time when a solution to which 135BTC was added dropwise became cloudy (aggregated) in a case in which 135BTC ethanol solution was added dropwise to BPEI_1 aqueous solution in Examples A1 and A2 was evaluated by determining the ratio (COOH/N) of the number of carboxy groups in the crosslinking agent (B) to the total number of nitrogen atoms in the compound (A). The results are listed in Table 1.

Whether the solution was cloudy or not was visually confirmed.

Examples B1 and B2

An aqueous solution (2% by mass) of branched polyethyleneimine 2 (BPEI_2; corresponding to branched polyethyleneimine, compound (A)) obtained as described above and 135BTC ethanol solution (2% by mass in Example B1, 9.5% by mass in Example B2) were prepared. The 135BTC ethanol solution was then gradually added dropwise to the BPEI_2 aqueous solution. At this time, the 135BTC ethanol solution was added dropwise to the BPEI_2 aqueous solution until the ratio (COOH/N) of the number of carboxy groups in the crosslinking agent (B) to the total number of nitrogen atoms in the compound (A) reached 0.71, to prepare a composition.

Example B3

To an aqueous solution of branched polyethyleneimine 2 (BPEI_2) (concentration after addition of acetic acid: 2% by mass), acetic acid (AA) was added until the ratio (COOH/N) of the number of carboxy groups in acetic acid to the total number of nitrogen atoms in BPEI_2 reached 0.29, and 135BTC ethanol solution (2% by mass) was then added dropwise thereto. Similarly to Example B1, a 135BTC ethanol solution was added dropwise to the BPEI_2 aqueous solution until the ratio (COOH/N) of the number of carboxy groups in the crosslinking agent (B) to the total number of nitrogen atoms in the compound (A) reached 0.71, to prepare a composition.

Examples B4 to B7, B9, B11, and B12

135BTC, oxydiphthalic acid (ODPA; 4,4'-oxydiphthalic acid), melitic acid (MeA; mellitic acid), 1,2,4-benzenetricarboxylic acid (124BTC), and pyromellitic acid (PMA) were prepared as the crosslinking agent (B), and ammonia (NH3; ammonia) and ethylamine (EA; ethylamine) were prepared as the base (C-2).

First, a base (C-2) was added to the crosslinking agent (B), and then the crosslinking agent (B) was dissolved in water or a mixed solvent (ethanol/water=0.24, based on mass). The concentration of a solution containing the crosslinking agent (B) and the base (C-2) is as listed in Table 1. The base (C-2) was added to the crosslinking agent (B) until the ratio (N/COOH) of the number of nitrogen atoms in the base (C-2) to the number of carboxy groups in the crosslinking agent (B) reached a value listed in Table 1.

A solution of the crosslinking agent (B) was then added dropwise to a BPEI_2 solution (solution of the compound (A)). At this time, a solution of the crosslinking agent (B) was added dropwise to the BPEI_2 aqueous solution, in Examples B4 to B7, and B9, similarly to Example B1, until the ratio (COOH/N) of the number of carboxy groups in the crosslinking agent (B) to the total number of nitrogen atoms in the compound (A) reached 0.71, in Example B11, until COOH/N reached 1.07, and in Example B12, until COOH/N reached 1.42, to prepare a composition.

Example B8

An aqueous solution (2% by mass) of branched polyethyleneimine 2 (BPEI_2) and an ethanol solution (6.4% by mass) of ethyl half ester pyromellitic acid (ehePMA; ethyl half ester PMA, corresponding to the crosslinking agent (B)) were prepared. ehePMA was prepared by adding pyromellitic dianhydride to ethanol and heating for 3 hours and 30 minutes on a water bath heated to 50° C. to completely dissolve the pyromellitic dianhydride powder. That an ester group was formed in the prepared ehePMA was confirmed by proton NMR. An ehePMA ethanol solution was then added dropwise to the BPEI_2 aqueous solution little by little. At this time, similarly to Example B1, the ehePMA ethanol solution was added dropwise to the BPEI_2 aqueous solution until the ratio (COOH/N) of the number of carboxy groups in the crosslinking agent (B) to the total number of nitrogen atoms in the compound (A) reached 0.71 to prepare a composition.

Example B10

An aqueous solution (2% by mass) of branched polyethyleneimine 2 (BPEI_2; branched polyethyleneimine, corresponding to compound (A)) and 124BTC ethanol solution (9.5% by mass) were prepared. The 124BTC ethanol solution was added dropwise little by little to the BPEI_2 aqueous solution. At this time, the 124BTC ethanol solution was added dropwise to the BPEI_2 aqueous solution until the ratio (COOH/N) of the number of carboxy groups in the crosslinking agent (B) to the total number of nitrogen atoms in the compound (A) reached 1.07, to prepare a composition.

Example C3

An aqueous solution (2% by mass) of 135BTC was added dropwise little by little to an aqueous solution (2% by mass) of branched polyethyleneimine 3 (BPEI_3; hyper branched polyethyleneimine, corresponding to the compound (A)) which was a highly branched polyethyleneimine. At this time, a 135BTC aqueous solution was added dropwise to the BPEI_3 aqueous solution until the ratio (COOH/N) of the number of carboxy groups in the crosslinking agent (B) to the total number of nitrogen atoms in the compound (A) reached 0.56, to prepare a composition.

Examples C4 to C11

124BTC, 135BTC, methyl half ester pyromellitic acid (mhePMA; methyl half ester PMA), ehePMA, ethyl half ester 1, 2,4-benzene tricarboxylic acid (ehe124BTC; ethyl half ester 124BTC) and 1-propyl half ester 1,2,4-benzene tricarboxylic acid (1Prhe124BTC; 1-propyl half ester 124BTC) were prepared as the crosslinking agent (B), respectively, and acetic acid (AA) was prepared as the acid (C-1).

mhePMA was prepared by adding pyromellitic dianhydride to methanol and refluxing in an oil bath heated to 80° C. for 120 minutes to completely dissolve pyromellitic dianhydride powder. That an ester group was formed in the prepared mhePMA was confirmed by proton NMR.

ehe124BTC was prepared by adding 124BTC anhydride to ethanol, stirring at room temperature to completely dissolve 124BTC anhydride powder. That an ester group was formed in the prepared ehe124BTC was confirmed by proton NMR.

1Prhe124BTC was prepared by adding 124BTC anhydride to 1-propanol, stirring at room temperature to completely dissolve the 124BTC anhydride powder. That an ester group was formed in the prepared 1Prhe124BTC was confirmed by proton NMR.

Next, in Examples C4, C5, C10, and C11, to the branched polyethyleneimine 3 (BPEI_3) aqueous solution, acetic acid (AA) was added until the ratio (COOH/N) of the number of carboxy groups in acetic acid to the total number of nitrogen atoms in BPEI_3 reached the value listed in Table 1, and the crosslinking agent (B) dissolved in the solvent listed in Table 1 was then added dropwise until the ratio (COOH/N) of the number of carboxy groups in the crosslinking agent (B) to the total number of nitrogen atoms in the compound (A) reached 0.56.

In Examples C6 to C9, the crosslinking agent (B) dissolved in a solvent listed in Table 1 was added dropwise to a branched polyethyleneimine 3 (BPEI_3) aqueous solution without adding acid (C-1) until the ratio (COOH/N) of the number of carboxy groups in the crosslinking agent (B) to the total number of nitrogen atoms in the compound (A) reached 0.56. In Table 1, 1PrOH represents 1-propanol.

Examples D1 to D8

An aqueous solution (2% by mass) of polyallylamine (PAA; polyallylamine, Mw=88,000, manufactured by Sigma-Aldrich, corresponding to the compound (A)) were prepared, and 124BTC, 135BTC, pyromellitic acid (PMA), mhePMA, ehePMA, and ehe124BTC were prepared as the crosslinking agent (B), and the crosslinking agent (B) was dissolved in ethanol in such a manner to have a concentration listed in Table 1.

Next, in Examples D1 to D6, an aqueous solution of the crosslinking agent (B) listed in Table 1 was added dropwise to the PAA aqueous solution without adding acid (C-1) until the ratio (COOH/N) of the number of carboxy groups in the crosslinking agent (B) to the total number of nitrogen atoms in the compound (A) reached 1.

In Examples D7 and D8, acetic acid (AA) was added to the PAA aqueous solution until the ratio (COOH/N) of the number of carboxy groups in acetic acid to the total number of nitrogen atoms in the PAA aqueous solution reached a value listed in Table 1, and an aqueous solution of the crosslinking agent (B) listed in Table 1 was then added dropwise until COOH/N (the ratio of the number of carboxy groups in the crosslinking agent (B) to the total number of nitrogen atoms in the compound (A)) reached 1.

The compositions and the like of the compositions obtained in the respective Examples and Comparative Examples are as listed in the following Table 1.

The parenthesis in the item "type of compound (A)" represents the concentration of the compound (A) in a solution of the compound (A), and in a case in which the acid (C-1) is added dropwise to the compound (A), the parenthesis represents the concentration of the compound (A) in the solution of the compound (A) after dropping of the acid (C-1).

"Concentration in composition" of the compound (A) represents the concentration of the compound (A) with respect to the total composition when the crosslinking agent (B) was dropped in such a manner that the ratio "COOH/N" of the number of carboxy groups in the crosslinking agent (B) to the total number of nitrogen atoms in the compound (A) was the maximum value.

The parenthesis in the item "type of crosslinking agent (B)" represents the concentration of the crosslinking agent (B) in a solution of the crosslinking agent (B), and in a case in which the base (C-2) was added dropwise to the crosslinking agent (B), the parenthesis represents the concentration of the crosslinking agent (B) in the solution of the crosslinking agent (B) after dropping of the base (C-2).

TABLE 1

| | | Compound (A) | | |
|---|---|---|---|---|
| | Type | Concentration in composition (% by mass) | Molar ratio of primary nitrogen atom/secondary nitrogen atom/tertiary nitrogen atom | Acid (C-1) |
| Example A1 | BPEI_1 aqueous solution (2% by mass) | 0.93 | 0.32/0.38/0.30 | |
| Example A2 | BPEI_1 aqueous solution (2% by mass) | 0.93 | 0.32/0.38/0.30 | AA [0.5] |
| Example B1 | BPEI_2 aqueous solution (2% by mass) | 0.93 | 0.31/0.40/0.29 | |
| Example B2 | BPEI_2 aqueous solution (2% by mass) | 1.61 | 0.31/0.40/0.29 | |
| Example B3 | BPEI_2 aqueous solution (2% by mass) | 0.93 | 0.31/0.40/0.29 | AA [0.29] |
| Example B4 | BPEI_2 aqueous solution (2% by mass) | 0.93 | 0.31/0.40/0.29 | |
| Example B5 | BPEI_2 aqueous solution (2% by mass) | 0.93 | 0.31/0.40/0.29 | |
| Example B6 | BPEI_2 aqueous solution (2% by mass) | 1.57 | 0.31/0.40/0.29 | |
| Example B7 | BPEI_2 aqueous solution (2% by mass) | 1.04 | 0.31/0.40/0.29 | |
| Example B8 | BPEI_2 aqueous solution (2% by mass) | 1.11 | 0.31/0.40/0.29 | |
| Example B9 | BPEI_2 aqueous solution (2% by mass) | 1.61 | 0.31/0.40/0.29 | |
| Example B10 | BPEI_2 aqueous solution (2% by mass) | 0.74 | 0.31/0.40/0.29 | |
| Example B11 | BPEI_2 aqueous solution (2% by mass) | 0.74 | 0.31/0.40/0.29 | |
| Example B12 | BPEI_2 aqueous solution (2% by mass) | 0.71 | 0.31/0.40/0.29 | |
| Example C3 | BPEI_3 aqueous solution (2% by mass) | 1.05 | 0.45/0.11/0.44 | |
| Example C4 | BPEI_3 aqueous solution (2% by mass) | 1.05 | 0.45/0.11/0.44 | AA [0.34] |
| Example C5 | BPEI_3 aqueous solution (2% by mass) | 1.05 | 0.45/0.11/0.44 | AA [0.28] |
| Example C6 | BPEI_3 aqueous solution (2% by mass) | 0.7 | 0.45/0.11/0.44 | |

TABLE 1-continued

| | | | | |
|---|---|---|---|---|
| Example C7 | BPEI_3 aqueous solution (2% by mass) | 1.23 | 0.45/0.11/0.44 | |
| Example C8 | BPEI_3 aqueous solution (2% by mass) | 1.29 | 0.45/0.11/0.44 | |
| Example C9 | BPEI_3 aqueous solution (2% by mass) | 1.29 | 0.45/0.11/0.44 | |
| Example C10 | BPEI_3 aqueous solution (2% by mass) | 1.29 | 0.45/0.11/0.44 | AA [0.022] |
| Example C11 | BPEI_3 aqueous solution (2% by mass) | 0.7 | 0.45/0.11/0.44 | AA [0.29] |
| Example D1 | PAA aqueous solution (2% by mass) | 0.9 | 1/0/0 | |
| Example D2 | PAA aqueous solution (2% by mass) | 0.9 | 1/0/0 | |
| Example D3 | PAA aqueous solution (2% by mass) | 0.95 | 1/0/0 | |
| Example D4 | PAA aqueous solution (2% by mass) | 0.58 | 1/0/0 | |
| Example D5 | PAA aqueous solution (2% by mass) | 1.08 | 1/0/0 | |
| Example D6 | PAA aqueous solution (2% by mass) | 1.14 | 1/0/0 | |
| Example D7 | PAA aqueous solution (2% by mass) | 0.58 | 1/0/0 | AA [5.5] |
| Example D8 | PAA aqueous solution (2% by mass) | 1.14 | 1/0/0 | AA [0.5] |

| | Crosslinking agent (B) | | | | The range of |
|---|---|---|---|---|---|
| | Type | The number of COOH | Base (C-2) | The range of COOH | COOH/N in which composition is transparent |
| Example A1 | 135BTC EtOH solution (2% by mass) | 3 | | 0-0.7 | 0-0.15 |
| Example A2 | 135BTC EtOH solution (2% by mass) | 3 | | 0-0.7 | 0-0.7 |
| Example B1 | 135BTC EtOH solution (2% by mass) | 3 | | 0-0.71 | 0-0.23 |
| Example B2 | 135BTC EtOH solution (9.5% by mass) | 3 | | 0-0.71 | 0-0.39 |
| Example B3 | 135BTC EtOH solution (2% by mass) | 3 | | 0-0.71 | 0-0.71 |
| Example B4 | 135BTC EtOH solution (2% by mass) | 3 | NH3 [1.5] | 0-0.71 | 0-0.71 |
| Example B5 | 135BTC (EtOH/H2O = 0.24 mixed solvent, 2% by mass) | 3 | EA [1] | 0-0.71 | 0-0.71 |
| Example B6 | ODPA aqueous solution (9.6% by mass) | 4 | NH3 [1.95] | 0-0.71 | 0-0.71 |
| Example B7 | MeA aqueous solution (2% by mass) | 6 | EA [1.3] | 0-0.71 | 0-0.71 |
| Example B8 | ehePMA EtOH solution (6.4% by mass) | 2 | | 0-0.71 | 0-0.71 |
| Example B9 | 135BTC aqueous solution (9.5% by mass) | 3 | NH3 [1.5] | 0-0.71 | 0-0.71 |
| Example B10 | 124BTC EtOH solution (9.5% by mass) | 3 | | 0-1.07 | 0-0.48 |
| Example B11 | 124BTC aqueous solution (9.5% by mass) | 3 | NH3 [1.5] | 0-1.07 | 0-1.07 |
| Example B12 | PMA aqueous solution (9.5% by mass) | 4 | NH3[1.5] | 0-1.42 | 0-1.42 |
| Example C3 | 135BTC EtOH solution (2% by mass) | 3 | | 0-0.56 | 0-0.20 |
| Example C4 | 124BTC EtOH solution (2% by mass) | 3 | | 0-0.56 | 0-0.56 |
| Example C5 | 135BTC EtOH solution (2% by mass) | 3 | | 0-0.56 | 0-0.56 |
| Example C6 | mhePMA EtOH solution (2% by mass) | 2 | | 0-0.56 | 0-0.30 |
| Example C7 | ehePMA EtOH solution (6.4% by mass) | 2 | | 0-0.56 | 0-0.56 |
| Example C8 | ehe124BTC EtOH solution (5.58% by mass) | 2 | | 0-0.56 | 0-0.55 |
| Example C9 | 1Prhe124 BTC 1PrOH solution (5.91% by mass) | 2 | | 0-0.56 | 0-0.56 |
| Example C10 | ehe124BTC EtOH solution (5.58% by mass) | 2 | | 0-0.56 | 0-0.56 |
| Example C11 | mhePMA EtOH solution (2% by mass) | 2 | | 0-0.56 | 0-0.56 |
| Example D1 | 124BTC EtOH solution (2% by mass) | 3 | | 0-1 | 0-0.12 |
| Example D2 | 135BTC EtOH solution (2% by mass) | 3 | | 0-1 | 0-0.16 |
| Example D3 | PMA EtOH solution (2% by mass) | 4 | | 0-1 | 0-0.19 |
| Example D4 | mhePMA EtOH solution (2% by mass) | 2 | | 0-1 | 0-0.3 |
| Example D5 | ehePMA EtOH solution (6.4% by mass) | 2 | | 0-1 | 0-0.43, 0.71-1 |
| Example D6 | ehe124BTC EtOH solution (5.58% by mass) | 2 | | 0-1 | 0-0.37 |
| Example D7 | mhePMA EtOH solution (2% by mass) | 2 | | 0-1 | 0-1 |
| Example D8 | ehe124BTC EtOH solution (5.58% by mass) | 2 | | 0-1 | 0-1 |

In Example A1, the solution to which 135BTC was added dropwise when the ratio (COOH/N) of the number of carboxy groups in the crosslinking agent (B) to the total number of nitrogen atoms in the compound (A) was from 0 to 0.15 was transparent without cloudiness, and the solution to which 135BTC was added dropwise when COOH/N was over 0.15 was cloudy. In other words, it was possible under a condition that COOH/N was 0.15 or less to prepare a composition in which agglomeration was suppressed without clouding. It is presumed that by forming a film using a composition in which agglomeration is suppressed without clouding, it is possible to form a smooth film with little unevenness.

In Example A2 in which the acid (C-1) was added to the compound (A), a solution to which 135BTC was added dropwise when the ratio (COOH/N) of the number of carboxy groups in the crosslinking agent (B) to the total number of nitrogen atoms in the compound (A) was from 0 to 0.7 was transparent without clouding, and even when a larger amount of 135BTC was added dropwise than in Example A1, it was possible to maintain the transparency of a composition.

In Example B3 in which the acid (C-1) was added to the compound (A), a solution to which 135BTC was added dropwise when the ratio (COOH/N) of the number of carboxy groups in the crosslinking agent (B) to the total number of nitrogen atoms in the compound (A) was from 0 to 0.71 was transparent without clouding, and even when a larger amount of 135BTC was added dropwise than in Examples B1 and B2, it was possible to maintain the transparency of a composition. Therefore, a film having more crosslinked structures such as amide, or imide between the compound (A) and the crosslinking agent (B) after a heat treatment and excellent heat resistance or insulation can be produced because a larger amount of crosslinking agent (B) can be mixed with compound (A) without clouding of the composition.

In Examples B4 to B7 and B9 in which the base (C-2) was added to the crosslinking agent (B) and in Example B8 in which the crosslinking agent (B) had the ester bond, a solution to which each crosslinking agent (B) was added dropwise when the ratio (COOH/N) of the number of carboxy groups in the crosslinking agent (B) to the total number of nitrogen atoms in the compound (A) was from 0 to 0.71 was transparent without clouding, and similarly to Example B3, it is possible to maintain transparency of a composition even when a larger amount of crosslinking agent (B) was added dropwise than in Examples B1 and B2.

In Examples B11 and B12 in which the base (C-2) was added to the crosslinking agent (B), a solution to which each crosslinking agent (B) was added dropwise when the ratio (COOH/N) of the number of carboxy groups in the crosslinking agent (B) to the total number of nitrogen atoms in the compound (A) was respectively from 0 to 1.07 and from 0 to 1.42 was transparent without clouding, and it was possible to maintain transparency of a composition even when a larger amount of crosslinking agent (B) was added dropwise than in Examples B10.

Also in Examples D1 and D6, it was shown that in Example D6 in which the crosslinking agent (B) had an ester bond, transparency of a composition can be maintained by adding dropwise a larger amount of crosslinking agent (B).

In Examples C4 and C5 in which the acid (C-1) was added to the compound (A), a solution to which the crosslinking agent (B) was added dropwise when the ratio (COOH/N) of the number of carboxy groups in the crosslinking agent (B) to the total number of nitrogen atoms in the compound (A) was from 0 to 0.56 was transparent without clouding, and even when a larger amount of crosslinking agent (B) was added dropwise than in Example C3, it was possible to maintain the transparency of a composition.

When comparing Examples C6 and C7 in which the crosslinking agent (B) had an ester bond, in Example C7, even when a larger amount of crosslinking agent (B) was added dropwise than in Example C6, it was possible to maintain the transparency of a composition. When comparing Examples C8 and C9 in which the crosslinking agent (B) had an ester bond, in Example C9, it was possible to maintain the transparency of a composition even when a larger amount of crosslinking agent (B) was added dropwise than in Example C8. For this reason, from the viewpoint of more suitably maintaining the transparency of a composition, it is assumed that it is preferable that the number of carbon atoms in the ester bond is large.

A similar tendency was seen also in Examples D4 and D5.

In Examples C10 and C11 in which the crosslinking agent (B) had an ester bond and the acid (C-1) was added to the compound (A), it was possible to maintain the transparency of a composition even when a larger amount of crosslinking agent (B) was added dropwise than in Examples C8 and C6, respectively. Therefore, from the viewpoint of more suitably maintaining the transparency of a composition, it is presumed that it is preferable that the crosslinking agent (B) has an ester bond and that the acid (C-1) is added to the compound (A).

A similar tendency was seen also in Examples D7 and D8.

<Prepare of Composition>

Examples 1 to 19, Comparative Examples 1 to 6

A composition having composition and pH listed in Table 2 below was prepared. Similarly to the above examples, when the acid (C-1) was used as the additive (C), the acid (C-1) was added to a solution of the compound (A), and then the crosslinking agent (B) was mixed, and when the base (C-2) was used as the additive (C), a solution obtained by adding the base (C-2) to the crosslinking agent (B) and then dissolving the crosslinking agent (B) in a solvent was mixed with a solution of the compound (A).

In Table 2, the concentration of the compound (A) is the concentration of the compound (A) in a composition, and the concentration in parentheses in a solvent other than water is the concentration of a solvent other than water in the composition.

In Table 2, the numeral value in parentheses in the crosslinking agent (B) or a COOX-containing compound other than the crosslinking agent (B) represents the ratio (COOH/N) of the number of carboxy groups in the crosslinking agent (B) to the total number of nitrogen atoms in the compound (A) or the ratio (COOX/N) of the number of COOX groups in a COOX-containing compound other than the crosslinking agent (B) to the total number of nitrogen atoms in the compound (A).

In Table 2, the numerical value in parentheses in the acid (C-1) represents the ratio (COOH/N) of the number of carboxy groups in the acid (C-1) to the total number of nitrogen atoms in the compound (A), and the numerical value in parentheses in the base (C-2) represent the ratio (N/COOH) of the number of nitrogen atoms in the base (C-2) to the number of carboxy groups in the crosslinking agent (B).

In Table 2, in Example 3, benzoic acid (BA; benzoic acid) was used as the acid (C-1). In Comparative Examples 2 and 4, malonic acid (MA; malonic acid) was used as a COOX-containing compound other than the crosslinking agent (B). In Comparative Examples 5 and 6, tripropyl-1,2,4-benzene tricarboxylic acid (TrPr124BTC; tripropyl-124BTC) was used as a COOX-containing compound other than the crosslinking agent (B).

TABLE 2

| | | Compound (A) | | Crosslinking agent (B) or | | | |
| | | | Concentration in composition (% by mass) | COOX-containing compound other than crosslinking agent (B) Type | Acid (C-1) or base (C-2) | Solvent other than water | pH |
| | Type | | | | | | |
|---|---|---|---|---|---|---|---|
| Comparative Example 1 | BPEI_3 aqueous solution | | 1 | | | | 9.94 |
| Comparative Example 2 | BPEI_3 aqueous solution | | 1 | MA [0.45] | | | 7.86 |
| Example 1 | BPEI_3 aqueous solution | | 1 | ehePMA [0.64] | | EtOH (34% by mass) | 4.68 |
| Example 2 | BPEI_3 aqueous solution | | 1 | ehePMA [0.96] | | EtOH (52% by mass) | 3.22 |
| Example 3 | BPEI_3 aqueous solution | | 1 | ehePMA [0.64] | BA {0.11} | EtOH (37% by mass) | 4.06 |
| Comparative Example 3 | BPEI_2 aqueous solution | | 1 | | | | 10.3 |
| Comparative Example 4 | BPEI_2 aqueous solution | | 1 | MA [0.71] | | | 4.97 |
| Comparative Example 5 | BPEI_2 aqueous solution | | 1 | TrPr124BTC [1.07] | | EtOH (97% by mass) | |
| Example 4 | BPEI_2 aqueous solution | | 1 | 135BTC [0.67] | AA {0.04} | EtOH (18% by mass) | 5.27 |
| Example 5 | BPEI_2 aqueous solution | | 1.5 | 135BTC [0.71] | NH3 <1.5> | | 9.84 |
| Example 6 | BPEI_2 aqueous solution | | 1.5 | 124BTC [1.07] | NH3 <1.5> | | 9.82 |

TABLE 2-continued

|  | Compound (A) | | Crosslinking agent (B) or | | | |
|---|---|---|---|---|---|---|
|  | Type | Concentration in composition (% by mass) | COOX-containing compound other than crosslinking agent (B) Type | Acid (C-1) or base (C-2) | Solvent other than water | pH |
| Example 7 | BPEI_2 aqueous solution | 1.5 | 124BTC [1.35] | NH3 <1.5> | | |
| Example 8 | BPEI_2 aqueous solution | 1.5 | PMA [1.42] | NH3 <1.5> | | 9.94 |
| Example 9 | BPEI_2 aqueous solution | 1.5 | PMA [1.80] | NH3 <1.5> | | |
| Example 10 | BPEI_2 aqueous solution | 0.15 | PMA [1.80] | NH3 <1.5> | | |
| Example 11 | BPEI_2 aqueous solution | 0.05 | PMA [1.80] | NH3 <1.5> | | |
| Example 12 | BPEI_2 aqueous solution | 2 | PMA [1.80] | NH3 <1.5> | | |
| Example 13 | BPEI_2 aqueous solution | 1 | ehePMA [1.01] | | EtOH (53% by mass) | 3.48 |
| Example 14 | BPEI_2 aqueous solution | 1 | 1Prhe124BTC [0.93] | | 1PrOH (44% by mass) | 3.88 |
| Example 15 | BPEI_2 aqueous solution | 0.1 | ehePMA [1.01] | | EtOH (56% by mass) | 3.8 |
| Example 16 | BPEI_2 aqueous solution | 0.05 | ehePMA [1.01] | | EtOH (57% by mass) | 3.85 |
| Example 17 | BPEI_2 aqueous solution | 1.5 | 135BTC [0.9] | NH3 <1.5> | | |
| Example 18 | BPEI_2 aqueous solution | 0.1 | 135BTC [0.9] | NH3 <1.5> | | |
| Comparative Example 6 | BPEI_1 aqueous solution | 1 | TrPr124BTC [0.32] | | EtOH (96% by mass) | 10.2 |
| Example 19 | PAA aqueous solution | 1 | ehePMA [0.99] | | EtOH (40% by mass) | 2.93 |

<Formation of Film>

A silicon substrate was prepared as a substrate to which a composition (hereinafter also referred to as "composition") was applied. A silicon substrate cleaned with UV ozone for 5 minutes was placed on the spin coater, 1.0 mL of the composition prepared in each Example and each Comparative Example was dropped at a constant speed for 10 seconds, held for 13 seconds, then rotated at 2,000 rpm (rpm is rotational speed) for 1 second, at 600 rpm for 30 seconds, then rotated at 2,000 rpm for 10 seconds to dry. By this, a film was formed on the silicon substrate.

Next, after drying at 125° C. for 1 minute, the film was heated at 300° C. for 10 minutes in a nitrogen atmosphere (30 kPa). For evaluation of heat resistance, the film was further heated at 350° C., 380° C., and 400° C. for 10 minutes (the same sample was continuously processed).

<Measurement of Refractive Index>

After heating at 400° C., the refractive index of the film formed on the silicon substrate was measured. The refractive index was measured using an ellipsometer. The film thickness was calculated from the measured optical data. When the film thickness was 10 nm or more, fitting was performed with an optical model of air/(Cauchy+Lorenz oscillator model)/natural oxide film/silicon substrate. When the film thickness was less than 10 nm, fitting was performed using an optical model of air/$SiO_2$/natural oxide film/silicon substrate. Since the film thickness is obtained by calculation, the result can be negative.

In Table 3, N633 represents the refractive index at a wavelength of 633 nm. The refractive index is better when the change is small, but less change is not essential.

The results are listed in Table 3.

<Heat Resistance Evaluation>

The heat resistance of the film was evaluated based on the film thickness residual rate calculated from the film thickness after heating at 300° C. for 10 minutes and the film thickness after heating at 380° C. for 10 minutes. The formula of the film thickness residual rate is as described below, and one having a film thickness residual rate of 20% or more was determined to be "heat resistant".

film thickness residual rate (%)=(film thickness after heating at 380° C./film thickness after heating at 300° C.)×100

The results are listed in Table 3.

<Crosslinked Structure>

The crosslinked structure of a film was measured by Fourier transform infrared spectroscopy (FT-IR). Analyzers used are as follows.

—FT-IR Analyzer—

Infrared absorption analyzer (DIGILAB Excalibur (manufactured by Digilab Inc.))

—Measurement Condition—

IR source: air-cooled ceramic, beam splitter: wide range KBr, detector: Peltier cooling DTGS, measurement wavenumber range: 7,500 $cm^{-1}$ to 400 $cm^{-1}$, resolution: 4 $cm^{-1}$, integration times: 256, background: Si bare wafer used, measurement atmosphere: $N_2$ (10 L/min), IR (infrared) incident angle: 72° (=Brewster angle of Si)

—Determination Conditions—

The imide bond was determined by the presence of a vibration peak at 1,770 $cm^{-1}$ and 1,720 $cm^{-1}$. The amide bond was determined by the presence of a vibration peak at 1,650 $cm^{-1}$, 1,520 $cm^{-1}$.

The results are listed in Table 3.

<SEM Morphology Observation>

For a film having a film thickness of from 20 nm to 300 nm, the smoothness of the film was evaluated by morphology observation by SEM. Measurement was carried out with an accelerating voltage of 3 kV, 200,000 times, 500 nm width field of view using a scanning electron microscope (SEM) S-5,000 (manufactured by Hitachi Ltd.). When the difference between the maximum film thickness and the minimum film thickness was not more than 25% of the average film thickness, it was determined to be "smooth".

The results are listed in Table 3. After heating at 400° C. for 10 minutes, the film was subjected to SEM morphology observation.

<SPM Morphology Observation>

For a film having a film thickness of less than 20 nm, the unevenness of the film was evaluated by morphology observation by SPM. Measurement was carried out in a 3 micron×3 micron square area in a dynamic force microscope mode using a scanning probe microscope (SPM) SPA400 (manufactured by Hitachi High-Technologies Corporation). When the root mean square surface roughness (RMS) measured by SPM was 25% or less with respect to the film thickness measured with an ellipsometer, it was determined to be "smooth".

The results are listed in Table 3. After heating at 300° C. or 400° C. for 10 minutes, the film was subjected to SPM morphology observation.

The measurement results and the evaluation results of the physical properties of films formed using the composition according to the Examples and Comparative Examples are listed in Table 3. The blank column in Table 3 represents unconfirmed (crosslinked structure) or not performed (SEM morphology observation and SPM morphology observation).

parative Examples 5 and 6, it was found that when a crosslinking agent having no COOH group was used instead of the crosslinking agent (B), irregularity of the film surface became large, and the film surface did not become a mirror surface.

In Examples 10, 11, and 18, the film was smooth as a result of SPM morphology observation. It was found that by using the base (C-2), a smooth film can be formed even with an extremely thin film of about 2 nm.

TABLE 3

|  | Film thickness after drying at 125° C. (nm) | Film thickness after heating at 300° C. (nm) | Film thickness after heating at 350° C. (nm) | Film thickness after heating at 380° C. (nm) | Film thickness after heating at 400° C. (nm) | Film thickness after heating at 400° C./N633 | Film thickness residual rate (%) | Crosslinked structure | SEM morphology observation | SPM morphology observation |
|---|---|---|---|---|---|---|---|---|---|---|
| Comparative Example 1 | 41.2 | 29.6 | 17.9 | 0.5 | −0.1 |  | 1.69 | None |  |  |
| Comparative Example 2 | 50.6 | 30 | 16 | 0.6 | −0.1 |  | 2.00 | Amide |  |  |
| Example 1 | 170.4 | 99.8 | 75.9 | 59.7 | 52.6 | 1.84 | 59.82 | Imide | 400° C. heated film with smoothness |  |
| Example 2 | 164.1 | 84.4 | 64.5 | 53.5 | 47.9 | 1.86 | 63.39 | Imide | 400° C. heated film with smoothness |  |
| Example 3 |  |  |  |  | 51.6 | 1.8 |  | Imide |  |  |
| Comparative Example 3 | 38.3 | 33.1 | 15.8 | 1.4 | 0.9 |  | 4.23 | None |  |  |
| Comparative Example 4 | 57 | 42 | 28.5 | 1 | 0 |  | 2.38 |  |  |  |
| Comparative Example 5 | Not mirror surface |  |  |  |  |  |  |  |  |  |
| Example 4 | 74.0 | 42.0 | 27.2 | 25.4 | 22.5 | 1.47 | 60.48 | Amide |  |  |
| Example 5 | 107.8 | 74.4 | 50.7 | 38.9 | 35.6 | 1.63 | 52.28 |  |  |  |
| Example 6 | 107.0 | 48.9 | 38.7 | 31.6 | 28.4 | 1.74 | 64.62 |  |  |  |
| Example 7 | 121.7 | 58.6 | 46.2 | 41.1 | 36.1 | 1.74 | 70.14 | Amide imide | 400° C. heated film with smoothness |  |
| Example 8 | 122.7 | 89.1 | 64.4 | 63.0 | 49.5 | 1.78 | 70.71 |  |  |  |
| Example 9 | 142.6 | 102.3 | 85.0 | 74.0 | 65.7 | 1.68 | 72.34 | Imide | 400° C. heated film with smoothness |  |
| Example 10 | 16.1 | 11.1 | 7.5 | 6.2 | 5.4 | 1.68 | 55.86 |  |  | 400° C. heated film with smoothness |
| Example 11 | 6.3 | 4.5 | 2.7 | 2.4 | 2.1 | 1.68 | 53.33 |  |  | 300° C. heated film with smoothness |
| Example 12 | 208.7 | 153.5 | 123.8 | 106.7 | 98.8 | 1.78 | 69.51 |  |  |  |
| Example 13 | 221.5 | 130.0 | 107.9 | 98.5 | 92.5 | 1.78 | 75.77 | Imide | 400° C. heated film with smoothness |  |
| Example 14 | 158.1 | 60.7 | 48.7 | 40.9 | 38.4 | 1.78 | 67.38 | Amide imide |  |  |
| Example 15 | 22.2 | 14.3 | 11.3 | 9.5 | 8.5 |  | 66.43 | Imide |  |  |
| Example 16 |  |  |  |  | 2.7 |  |  |  |  |  |
| Example 17 | 103.6 | 72.3 | 48.2 | 36.7 | 32.1 | 1.80 | 50.76 | Amide | 400° C. heated film with smoothness |  |
| Example 18 |  |  |  |  | 3.0 |  |  |  |  | 400° C. heated film with smoothness |
| Comparative Example 6 | Not mirror surface |  |  |  |  |  |  |  |  |  |
| Example 19 | 114.9 | 50.7 | 49.4 | 48.1 | 46.3 | 1.71 | 94.87 |  |  |  |

As listed in Table 3, in each of Examples 1, 2, 4 to 15, 17 and 19, the film thickness residual rate was 20% or more, while the film thickness residual rate in each of Comparative Examples 1 to 4 was less than 5%. From this, it is assumed that a film formed from the composition in each Example is excellent in heat resistance.

In Examples 1, 2, 7, 9, 13 and 17, the film was smooth as a result of SEM morphology observation.

In Comparative Examples 5 and 6, the film surface did not become a mirror surface and was not smooth. From Com- <In-Plane Film Thickness Distribution of Silicon Substrate>

Example 20

The BPEI_2 aqueous solution and a solution obtained by adding $NH_3$ (N/COOH=1.1) as a base (C-2) to 135BTC were mixed in such a manner that the ratio (COOH/N) of the number of carboxy groups in 135BTC to the number of nitrogen atoms in BPEI_2 was 0.9 to obtain a composition (coating solution).

Then, after dropping 6 mL of coating liquid on a 300 mmφ silicon substrate, the silicon substrate was rotated at 1,000 rpm for 1 second, at 600 rpm for 60 seconds, and at 1,000 rpm for 5 seconds, then dried at 100° C. for 2 minutes, heated at 250° C. for 1 minute, and further heat treated at 400° C. for 10 minutes at atmospheric pressure in nitrogen. A film was thus formed on the silicon substrate.

Comparative Example 7

After dropping 6 mL of BPEI_2 aqueous solution on a 300 mmφ silicon substrate, the silicon substrate was rotated at 1,000 rpm for 1 second, at 600 rpm for 60 seconds, and at 1,000 rpm for 5 seconds, and then dried at 100° C. for 2 minutes. Next, while rotating a wafer at 3,000 rpm, 10 mL of 135BTC isopropanol (IPA) solution (1.4% by mass) was dropped onto the dried BPEI_2. After adding dropwise, the wafer was heated at 250° C. for 1 minute, and further heat treated at 400° C. for 10 minutes. A film was thus formed on the silicon substrate.

Film thicknesses at 1 cm, 5 cm, 9 cm, and 13 cm from the center of a 300 mmφ silicon substrate, and the difference (%) between film thicknesses at 1 cm and 13 cm from the center were determined, and the in-plane film thickness distribution of the silicon substrate was evaluated.

The results are listed in Table 4.

In Table 4, the concentration in parentheses in the BPEI_2 aqueous solution (2% by mass) and BPEI_2 aqueous solution (1.7% by mass) represents the concentration of BPEI_2 in the composition, and the concentration in parentheses in 135BTC (1.4% by mass, solvent IPA) represents the concentration of 135BTC in the composition.

124BTC to the number of nitrogen atoms in BPEI_2) reached 0.81, and ethanol was mixed thereto in such a manner that the concentration of ethanol (EtOH) with respect to the total composition was 27% by mass to prepare a composition (solution 1).

Next, 0.5 mL of the composition was added dropwise on a silicon oxide substrate provided with a trench pattern of 100 nm width and 200 nm depth, and then the silicon oxide substrate was rotated at 1,000 rpm for 5 seconds and 500 rpm for 30 seconds. Next, the composition added dropwise was dried at 100° C. for 1 minute, then heated at 250° C. for 1 minute, and further heat treated at 400° C. for 10 minutes.

Whether the composition was filled in the trench with a cross sectional SEM was observed. A case in which the filled area was 90% or more of the area inside the trench was taken as A (favorable filling property).

The results are listed in Table 5.

In Table 5, the concentration in the parentheses in the BPEI_2 aqueous solution (3.1% by mass) indicates the concentration of BPEI_2 in the composition.

TABLE 5

| Sample | | Filling property |
|---|---|---|
| Example 21 | Solution 1: BPEI_2 aqueous solution (3.1% by mass) + 124BTC [0.81] + AA{1.0} + EtOH (27% by mass) (pH 7) | A |

TABLE 4

| | Solution | | Film thickness at 1 cm from center (nm) | Film thickness at 5 cm from center (nm) | Film thickness at 9 cm from center (nm) | Film thickness at 13 cm from center (nm) | Difference between film thicknesses at 1 cm and 13 cm from center (%) |
|---|---|---|---|---|---|---|---|
| Comparative Example 7 | BPEI_2 aqueous solution (2.0% by mass) | Further applying 135BTC (1.4% by mass, solvent: IPA) | 80.4 | 77.4 | 72.4 | 66.8 | 18.3 |
| Example 20 | BPEI_2 aqueous solution (1.7% by mass) + 135BTC [0.9] + NH3 <1.1> | — | 59.7 | 58.9 | 58.5 | 57 | 4.6 |

As listed in Table 4, the difference (%) between film thicknesses at 1 cm and 13 cm from the center was smaller in the Example (5% or less) than in the Comparative example (more than 5%). Therefore, it was shown that a smooth film excellent in in-plane uniformity can be obtained in a simpler process in a 300 mmφ silicon wafer by using the composition according to Example 20.

<Filling Property in Trench>

Example 21

Acetic acid (AA) as an acid (C-1) was added to a BPEI_2 aqueous solution in such a manner that COOH/N (the ratio of the number of carboxy groups in acetic acid to the number of nitrogen atoms in BPEI_2) reached 1.0. Next, 124BTC was mixed in the BPEI_2 aqueous solution in such a manner that COOH/N (the ratio of the number of carboxy groups in <Relative Dielectric Constant and Leakage Current Density>

Example 22

Acetic acid (AA) as acid (C-1) was added to BPEI_2 aqueous solution in such a manner that COOH/N (ratio of the number of carboxy groups in acetic acid to the number of nitrogen atoms in BPEI_2) was 0.14. Next, 135BTC was mixed in a BPEI_2 aqueous solution in such a manner that COOH/N (the ratio of the number of carboxy groups in 135BTC to the number of nitrogen atoms in BPEI_2) was 0.67, and ethanol was mixed in such a manner to adjust the concentration of ethanol (EtOH) to the total composition to 33 mass %, to prepare a composition (solution 2).

Example 23

A solution obtained by adding $NH_3$ (N/COOH=1.5) as a base (C-2) to 135BTC was mixed in a BPEI_2 aqueous solution in such a manner that the ratio (COOH/N) of the number of carboxy groups in 135BTC to the number of nitrogen atoms in BPEI_2 was 0.9, and ethanol was mixed therewith in such a manner that the concentration of ethanol (EtOH) with respect to the total composition was 33% by mass, to prepare a composition (solution 3).

After 5 mL of the composition was added dropwise on a low resistance silicon substrate, the low resistance silicon substrate was rotated at 1,000 rpm for 5 seconds and at 500 rpm for 30 seconds. Next, the composition added dropwise was dried at 100° C. for 1 minute, then heated at 250° C. for 1 minute, and further heat treated at 400° C. for 10 minutes. As a result, a layered body including a low resistance silicon substrate/film was obtained.

(Measurement of Relative Dielectric Constant)

The relative dielectric constant of the film in the obtained layered body was measured.

The relative dielectric constant was measured by an ordinary method at a frequency of 100 kHz in an atmosphere of 25° C. and 30% relative humidity using a mercury probe device (SSM5130).

The results are listed in Table 6.

(Measure of Leakage Current Density)

Next, in order to evaluate the electric characteristics, the leakage current density was measured as follows. Specifically, a mercury probe was placed on the film surface of the obtained layered body, and a measured value at an electric field strength of 1 MV/cm was taken as the leakage current density.

The results are listed in Table 6.

In Table 6, the composition, relative dielectric constant, and leakage current density of the samples in Examples 22 and 23 are listed.

In Table 6, the concentration in BPEI_2 aqueous solution (1.8% by mass) and BPEI_2 aqueous solution (1.7% by mass) represents the concentration of BPEI_2 in the composition.

<Preparation of Silicon Substrate with Interlayer Insulating Layer (Low-k Film)>

(Preparation of Precursor Solution)

77.4 g of bistriethoxysilylethane and 70.9 g of ethanol were mixed and stirred at room temperature, 80 mL of 1 mol/L nitric acid was added, and the mixture was stirred at 50° C. for 1 hour. Next, a solution of 20.9 g of polyoxyethylene (20) stearyl ether dissolved in 280 g of ethanol was mixed. After mixing, the mixture was stirred at 30° C. for 4 hours. The obtained solution was concentrated to 105 g under reduced pressure of 30 hPa at 25° C. After concentration, a solution of 1-propyl alcohol and 2-butyl alcohol in a volume ratio of 2:1 was added to obtain 1,800 g of a precursor solution.

(Preparation of Composition for Forming Porous Silica)

3.4 g of dimethyldiethoxysilane and 1.8 g of hexamethyldisiloxane were added to 472 g of the precursor solution and stirred at 25° C. for 1 hour to obtain a composition for forming porous silica. The amounts of dimethyldiethoxysilane and hexamethyldisiloxane added at this time were 10% by mole and 5% by mole with respect to bistriethoxysilylethane, respectively.

(Formation of Interlayer Insulating Layer)

1.0 mL of the composition for forming porous silica was added dropwise on the surface of a silicon substrate, the silicon substrate was rotated at 2,000 rpm for 60 seconds to coat the surface of the silicon substrate, and then heat treated in a nitrogen atmosphere at 150° C. for 1 minute and then at 350° C. for 10 minutes. Thereafter, the interlayer insulating layer (porous silica film) was obtained by heat treatment to 350° C. in a chamber equipped with a 172 nm excimer lamp and irradiation with ultraviolet light for 10 minutes at an output of 14 $mW/cm^2$ at a pressure of 1 Pa.

A silicon substrate with the interlayer insulating layer (hereinafter also referred to as "Low-k film") was thus obtained.

The silicon substrate with the low-k film (contact angle of 30° or less) obtained as described above was prebaked at 380° C. for 10 minutes under nitrogen (30 kPa). After prebaking, a silicon substrate with Low-k film was placed on a spin coater, 1.0 mL of the composition was added dropwise

TABLE 6

| Sample | Relative dielectric constant | Leakage current density (A/cm2) *Electric field strength 1 MV/cm | Film thickness (nm) |
|---|---|---|---|
| Example 22 | Solution 2: BPEI_2 aqueous solution (1.8% by mass) + 135BTC [0.67] + AA{0.14} + EtOH (33% by mass) | 4.7 | 1.00E−07 | 43.5 |
| Example 23 | Solution 3: BPEI_2 aqueous solution (1.7% by mass) + 135BTC [0.9] + NH3 <1.5> + EtOH (33% by mass) | 5.0 | 8.80E−08 | 59 |

Example 24 ehePMA was mixed with a BPEI_2 aqueous solution (0.05% by mass with respect to the total composition) in such a manner that COOH/N (the ratio of the number of carboxy groups in ehePMA to the number of nitrogen atoms in BPEI_2) was 1.01, and ethanol was mixed in such a manner that the concentration of ethanol (EtOH) with respect to the total composition was 56% by mass to prepare a composition (solution 4).

thereonto at a constant rate for 10 seconds, held for 13 seconds, rotated at 2,000 rpm for 1 second, 600 rpm for 30 seconds, then rotated at 2,000 rpm for 10 seconds to dry. Thereafter, the composition was dried at 125° C. for 1 minute and then heat treated at 400° C. for 10 minutes in a nitrogen atmosphere (30 kPa). As a result, a layered body including a silicon substrate/interlayer insulating layer (Low-k film)/film was obtained.

In the silicon substrate with a low-k film and the layered body obtained as described above, the thickness of the Low-k film, the thickness of a pore sealed portion of the Low-k film, the refractive index of the Low-k film, aperture of the surface, and the pore radius of the surface were obtained using an ellipsometer apparatus of an optical porosimeter (PS-1200) manufactured by SEMILAB JAPAN K.K. In the layered body, Low-k film/film (pore seal layer) was analyzed with an optical two-layer model.

The results are listed in Table 7.

Sealing property was evaluated by toluene adsorption measurement on the surface of the pore-seal layer of the sample (Si/Low-k film/pore seal layer). This toluene adsorption measurement indicates that the smaller the toluene adsorption amount was, the higher the sealing property for preventing the penetration of a wiring material (such as copper) into the Low-k film was.

Toluene adsorption measurement was carried out using an optical porosimeter (PS-1200) manufactured by SEMILAB JAPAN K.K.

Measurement was performed according to the method described in M. R. Baklanov, K. P. Mogilnikov, V. G Polovinkin, and F. N. Duitsey, *Journal of Vacuum Science and Technology B* (2000) 18, 1385-1391.

Specifically, in the temperature range of from 23 to 26° C., the sample chamber containing the sample (Si/Low-k film/pore seal layer) was evacuated to 5 mTorr, and then the toluene gas was sufficiently and slowly introduced into the sample chamber. At each pressure, the refractive index of the Low-k film was measured in situ by an ellipsometer. This operation was repeated until the sample chamber pressure reached saturated vapor pressure of toluene. Similarly, while evacuating the atmosphere in the sample chamber gradually, the refractive index was measured at each pressure. By the above operation, change in refractive index due to adsorption and desorption of toluene to the Low-k film was determined. Further, a toluene gas adsorption-desorption isotherm was obtained from the relative pressure characteristic of the refractive index using the Lorentz-Lorentz formula.

The above toluene gas adsorption-desorption isotherm is an isothermal line illustrating the relationship between toluene relative pressure ($P/P_0$; where P represents the partial pressure of toluene at room temperature, and $P_0$ represents the saturated vapor pressure of toluene at room temperature.) and the volume fraction of toluene adsorption amount (ratio of adsorption volume of toluene at room temperature to volume of whole Low-k film; the unit: "%"). The volume fraction of the toluene adsorption amount was obtained based on the refractive index of the Low-k film using the Lorentz-Lorentz formula.

Based on the toluene gas adsorption-desorption isotherm, the volume fraction (%) of the toluene adsorption amount when the toluene relative pressure ($P/P_0$) was 1.0 was determined, and based on the obtained value, the sealing property was evaluated. In this evaluation, the smaller the volume fraction (%) of the toluene adsorption amount was, the higher the sealing property was.

The pore radius was calculated from the desorption isotherm of toluene. Calculation of the pore radius was carried out using the Kelvin formula according to the method described in M. R. Baklanov, K. P. Mogilnikov, V. G Polovinkin, and F. N. Duitsey, *Journal of Vacuum Science and Technology B* (2000) 18, 1385-1391.

The results are listed in Table 7.

TABLE 7

| | | Film thickness of Low-k film (nm) | Thickness of pore sealed portion of Low-k film (nm) | Refractive index of Low-k film at wavelength of 633 nm | Refractive index of pore sealed portion at wavelength of 633 nm | Volume fraction of toluene adsorption (%) | Surface pore radius (nm) |
|---|---|---|---|---|---|---|---|
| Base | Silicon substrate with Low-k film | 105.9 | 0 | 1.3131 | — | 32.1 | 1.37 |
| Example 24 | Solution 4: BPEI_2 aqueous solution (0.05% by mass) + ehePMA [1.01] + EtOH (56% by mass) (pH 3.85) | 91.5 | 9.6 | 1.3038 | 1.7071 | 3.8 | 0.6 |

As listed in Table 7, by forming a pore seal layer on the surface of the Low-k film using the composition according to Example 24, a high density (high refractive index) pore seal layer can be formed on the surface of the Low-k film while maintaining the refractive index of the Low-k film low, and favorable sealing property was obtained.

Example 25 ehePMA was mixed with a PAA aqueous solution (1% by mass with respect to the total composition) in such a manner that COOH/N (the ratio of the number of carboxy groups in ehePMA to the number of nitrogen atoms in PAA) was 0.99, and ethanol was mixed in such a manner that the concentration of ethanol (EtOH) with respect to the total composition was 40% by mass, to prepare the composition (solution 5).

A silicon substrate with an interlayer insulating layer (Low-k film) was prepared in the same manner as described above, except that the amount of polyoxyethylene (20) stearyl ether used was changed from 20.9 g to 41.8 g. The prepared silicon substrate with a Low-k film (contact angle of 30° or less) was pre-baked at 380° C. for 10 minutes under nitrogen (30 kPa). After prebaking, the silicon substrate with a Low-k film was placed on a spin coater, 1.0 mL of the above composition was added dropwise thereto at a constant rate for 10 seconds, and after holding for 13 seconds, the substrate was rotated at 2,000 rpm for 1 second, at 600 rpm for 30 seconds, then rotated at 2,000 rpm for 10 seconds to dry. Thereafter, the composition was dried at 125° C. for 1 minute, then heat treated at 400° C. for 10 minutes, and further heat treated for 20 minutes (heating time at 400° C. for 30 minutes). As a result, a layered body including a silicon substrate/interlayer insulating layer (Low-k film)/film was obtained.

For the layered body after heat treatment at 400° C. for 10 minutes as described above and layered body after heat treatment at 400° C. for 10 minutes and further heat treatment for 20 minutes (in other words, heat treatment at 400° C. for 30 minutes), the overall film thickness and refractive index of the Low-k film/film (pore filling material) were determined using an ellipsometer device. The void volume was calculated from the refractive index at a wavelength of 633 nm using a Lorentz-Lorentz formula for a void, polymer, and silica skeleton.

The results are listed in Table 8.

TABLE 8

|  |  | 400° C. heat treatment time (min) | Film thickness of Low-k film (nm) | Refractive index at wavelength of 633 nm | Void volume (%) | Pore radius (nm) |
| --- | --- | --- | --- | --- | --- | --- |
| Base | Silicon substrate with Low-k film |  | 101.4 | 1.2431 | 47.1 | 2.41 |
| Example 25 | Solution 5: PAA aqueous solution (1% by mass) + ehePMA [0.99] + EtOH (40% by mass) (pH 2.93) | 10 30 | 151.2 151 | 1.4782 1.4674 | 14 16 |  |

The composition according to Example 25 was used to form a film to be a pore filling material on the Low-k film, the pore filling material uniformly penetrated into the Low-k film, and the void volume was favorably reduced. Even after heating at 400° C. for 30 minutes, the change in void volume was extremely small.

Example 26 ehePMA was mixed with a BPEI_2 aqueous solution (1% by mass with respect to the total composition) in such a manner that COOH/N (the ratio of the number of carboxy groups in ehePMA to the number of nitrogen atoms in BPEI_2) was 0.71, and ethanol was mixed therein in such a manner that the concentration of ethanol (EtOH) with respect to the total composition was 37% by mass to prepare a composition (solution 6).

Example 27

1Prhe124BTC was mixed with a BPEI_2 aqueous solution (1% by mass with respect to the total composition) in such a manner that COOH/N (the ratio of the number of carboxy groups in 1Prhe124BTC to the number of nitrogen atoms in BPEI_2) was 0.71, and 1-propanol was mixed therein in such a manner that the concentration of 1-propanol (1PrOH) with respect to the total composition was 33% by mass to prepare a composition (solution 7).

Example 28

BPEI_2 aqueous solution (1.5% by mass with respect to the total composition) and a solution obtained by adding $NH_3$ (N/COOH=1.5) as a base (C-2) to 135BTC were mixed in such a manner that the ratio (COOH/N) of the number of carboxy groups in 135BTC to the number of nitrogen atoms in BPEI_2 was 0.71 to prepare a composition (solution 8).

Next, a silicon substrate was placed on the spin coater, 1.0 mL of the composition prepared in Examples 26 to 28 was dropped at a constant speed for 10 seconds, held for 13 seconds, then rotated at 2,000 rpm (rpm is rotational speed) for 1 second, at 600 rpm for 30 seconds, then rotated at 2,000 rpm for 10 seconds to dry. By this, a film was formed on the silicon substrate.

Next, after drying at 125° C. for 1 minute, the film was heated at 400° C. for 10 minutes in a nitrogen atmosphere (30 kPa).

<Evaluation of Adhesiveness>

For evaluating the adhesiveness of a film, a copper film (100 nm in thickness) was formed on a film by sputtering to form an electrode, and to Bonn a layered body in which a silicon substrate/film/electrode (copper film) was layered in this order. The adhesiveness in the layered body having electrodes formed was evaluated as follows. Specifically, on the copper film side surface of the layered body, 5×5 square cells of 0.2 cm square were formed with a cutter, Scotch tape (No. 56 manufactured by 3M Company) was pasted, after that, the tape was peeled off at a stretch, and the number of peeled cells was counted.

The results are listed in Table 9.

TABLE 9

|  |  | Adhesiveness: Cu/polymer/Si grid test |
| --- | --- | --- |
|  | Silicon substrate | 19 cells peeled |
| Example 26 | Solution 6: BPEI_2 aqueous solution (1% by mass) + ehePMA [0.71] + EtOH (37% by mass) (pH 4.07) | No peeling |
| Example 27 | Solution 7: BPEI_2 aqueous solution (1% by mass) + 1Prhe124BTC [0.71] + 1PrOH (33% by mass) (pH 9.74) | No peeling |
| Example 28 | Solution 8: BPEI_2 aqueous solution (1.5% by mass) + 135BTC [0.71] + NH3 <1.5> | No peeling |

Adhesiveness was evaluated on a silicon substrate on which no film was formed, and as a result, 19 cells were peeled (peeled surface; silicon substrate/copper film). On the other hand, when a film was formed using the composition according to Examples 26 to 28, there was no peeling between the silicon substrate and the copper film, and the adhesiveness was favorable.

Example 29

<Thickness Evaluation of Polymer Layer on Silicon (Si)>
(Prepare of Composition)

ehePMA was mixed with BPEI_2 aqueous solution (0.25% by mass with respect to the total composition) in such a manner that COOH/N (the ratio of the number of carboxy groups in ehePMA to the number of nitrogen atoms in BPEI_2) was 0.71, and ethanol was mixed in such a manner that the concentration of ethanol (EtOH) with respect to the total composition was 9% by mass, to prepare a composition (solution 9).

(Preparation of Thickness Measurement Sample)

A silicon wafer having silica on its surface is prepared, the silicon wafer was placed on a spin coater, 1.0 mL of the solution 9 was added dropwise at a constant rate for 10 seconds, held for 13 seconds, the silicon wafer was then rotated at 2,000 rpm for 1 second, Further, this silicon wafer was rotated at 600 rpm for 30 seconds, then rotated at 2,000 rpm for 10 seconds and dried.

As described above, a polymer layer was formed on a silicon wafer, and a layered body (hereinafter also referred to as "sample (Si/polymer)") having a structure in which a silicon wafer and a polymer layer were layered was obtained.

The sample (Si/polymer) was placed on a hot plate in such a manner that the silicon wafer surface and the hot plate were in contact with each other, and subjected to soft baking (heat treatment) at a soft bake temperature of 120° C. for 60 seconds in the air atmosphere.

Here, the soft bake temperature is the temperature of the surface of a silicon wafer (the temperature of the surface on which the silicon wafer is formed before film formation).

(Cleaning Treatment)

While the sample (Si/polymer) was rotated at 600 rpm using a spin coater, ultrapure water (liquid temperature 22° C.) as a rinsing liquid was dropped on the polymer layer at a dropping rate of 0.1 mL/sec for 30 seconds to clean the polymer layer, and the sample was then rotated at 2,000 rpm for 60 seconds and dried.

(Thickness Evaluation of Polymer Layer after Cleaning Treatment)

Next, the thickness of the polymer layer of the sample after the cleaning treatment obtained as described above was measured. The thickness (nm) of the polymer layer was measured by an ordinary method using an ellipsometer of an optical porosimeter (PS-1200) manufactured by SEMILAB JAPAN K.K.

The results are listed in Table 10.

<Evaluation of Thickness of Polymer Layer on Copper (Cu)>

(Preparation of Thickness Measurement Sample)

Using a substrate obtained by forming a copper film of 100 nm on a silicon substrate by plating and cleaning this copper film surface by helium plasma treatment, in order to form a seal layer (polymer layer) on the copper film surface after the plasma treatment, a similar treatment to <Evaluation of Thickness of Polymer Layer on Silicon (Si)> was performed.

Thus, a layered body (hereinafter also referred to as "sample (Cu/polymer)") having a structure in which a polymer layer was formed on copper, and copper and a polymer layer were layered was obtained.

(Cleaning Treatment)

While the sample (Cu/polymer) was rotated at 600 rpm using a spin coater, ultrapure water (liquid temperature 22° C.) as a rinsing liquid was dropped on the polymer layer at a dropping rate of 0.1 mL/sec for 30 seconds to clean the polymer layer, and the sample was then rotated at 2,000 rpm for 60 seconds and dried.

(Thickness Evaluation of Polymer Layer after Cleaning Treatment)

Next, the thickness of the polymer layer of the sample after the cleaning treatment obtained as described above was measured. The thickness (nm) of the polymer layer on copper (Cu) was measured by the following method using an ellipsometer of an optical porosimeter (PS-1200) manufactured by SEMILAB JAPAN K.K.

In other words, the thickness of the polymer layer on the optically flat copper substrate was calculated by regressing polarization parameters measured by ellipsometry with a multilayer optical model: (air)/(polymer layer)/(copper substrate) using WinElli II. The range of light energy used is from 2.2 to 5.0 eV. Here, the same value as silica ($SiO_2$) was always used for the refractive index of a polymer layer. As the refractive index and extinction coefficient of the copper substrate, values obtained using WinElli II of analysis software after measurement of polarization parameters of a copper substrate not having a polymer layer were used.

The results are listed in Table 10.

TABLE 10

| | Soft bake temperature (° C.) | Thickness of film on Si (nm) | Thickness of film on Cu (nm) |
|---|---|---|---|
| Example 29 | 120 | 2.3 | −0.1 |
| Example 30 | 130 | 11.1 | 0.4 |
| Example 31 | 140 | 29.2 | −0.3 |
| Example 32 | 150 | 26 | 6.2 |

Examples 30 to 32

As listed in Table 10, the film thicknesses of a polymer on Si and a polymer on Cu were measured in a similar manner to Example 29 except that the soft bake temperature was changed from 130° C. to 150° C.

The results are listed in Table 10.

As listed in Table 10, in each Example, the thickness (thickness of film on Cu) of the polymer layer on Cu was ¼ or less of the thickness of the polymer layer on Si (thickness of film on Si), and the thickness of the polymer layer on Cu was sufficiently reduced.

The disclosure of Japanese Patent Application No. 2015-224196 filed on Nov. 16, 2015 is hereby incorporated by reference in its entirety.

All documents, patent applications, and technical standards described in this specification are incorporated herein by reference to the same extent as if each individual document, patent application, and technical specification is specifically and individually indicated to be incorporated by reference.

The invention claimed is:

1. A composition for forming a film for semiconductor devices comprising:
    a compound (A) including a cationic functional group containing at least one of a primary nitrogen atom or a secondary nitrogen atom and having a weight average molecular weight of from 10,000 to 400,000;
    a crosslinking agent (B) which includes three or more —C(═O)OX groups (X is a hydrogen atom or an alkyl group having from 1 to 6 carbon atoms) in a molecule, wherein from one to six of the three or more —C(═O)OX groups are —C(═O)OH groups, and which has a weight average molecular weight of from 200 to 600; and
    water (D),
    wherein the compound (A) is an aliphatic amine, the crosslinking agent (B) has a ring structure in the molecule, a ratio (COOH/N) of a number of carboxy groups in the crosslinking agent (B) to a total number of nitrogen atoms in the compound (A) is from 0.1 to 3.0, and the composition does not comprise a crosslinking agent other than the crosslinking agent (B).

2. The composition for forming a film for semiconductor devices according to claim 1, wherein the ring structure is at least one of a benzene ring or a naphthalene ring.

3. The composition for forming a film for semiconductor devices according to claim 1, wherein the crosslinking agent (B) is a compound in which at least one X in the three or more —C(=O)OX groups is an alkyl group having from 1 to 6 carbon atoms.

4. The composition for forming a film for semiconductor devices according to claim 1, further comprising at least one additive (C) selected from the group consisting of an acid (C-1) having a carboxy group and having a weight average molecular weight of from 46 to 195 and a base (C-2) having a nitrogen atom and having a weight average molecular weight of from 17 to 120.

5. The composition for forming a film for semiconductor devices according to claim 1, wherein the weight average molecular weight of the compound (A) is from 10,000 to 200,000.

6. The composition for forming a film for semiconductor devices according to claim 1, wherein a pH of the composition for forming a film for semiconductor devices at 25° C. is 7.0 or less.

7. A material for forming an adhesion layer between a metal and an insulating film comprising the composition for forming a film for semiconductor devices according to claim 1.

8. A pore seal material of a low dielectric constant material comprising the composition for forming a film for semiconductor devices according to claim 1.

9. A filling material for a recess formed in a substrate comprising the composition for forming a film for semiconductor devices according to claim 1.

10. A method of manufacturing the composition for forming a film for semiconductor devices according to claim 1, the method comprising:

mixing the compound (A), the crosslinking agent (B) and the water (D).

11. The method according to claim 10,
wherein the mixing comprises mixing a mixture of an acid (C-1) having a carboxy group and having a weight average molecular weight of from 46 to 195 and the compound (A), and the crosslinking agent (B).

12. The method according to claim 10,
wherein the mixing comprises mixing a mixture of a base (C-2) having a nitrogen atom and having a weight average molecular weight of from 17 to 120 and the crosslinking agent (B), and the compound (A).

13. A method of manufacturing a semiconductor member using the composition for forming a film for semiconductor devices according to claim 1, the method comprising:

applying the composition for forming a film for semiconductor devices to a substrate; and heating the substrate to which the composition for forming a film for semiconductor devices has been applied, at a temperature of from 250° C. to 425° C.

14. A method of manufacturing a semiconductor processing material using the composition for forming a film for semiconductor devices according to claim 1, the method comprising:

applying the composition for forming a film for semiconductor devices to a substrate; and heating the substrate to which the composition for forming a film for semiconductor devices has been applied, at a temperature of from 250° C. to 425° C.

* * * * *